United States Patent
Ogura et al.

(10) Patent No.: US 6,295,576 B1
(45) Date of Patent: Sep. 25, 2001

(54) ASSOCIATIVE MEMORY HAVING A MASK FUNCTION FOR USE IN A NETWORK ROUTER

(75) Inventors: Naoyuki Ogura; Tutomu Murase, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/144,066

(22) Filed: Aug. 31, 1998

(30) Foreign Application Priority Data

Aug. 29, 1997 (JP) .................................................. 9-234250

(51) Int. Cl.[7] ...................................................... G06F 12/00
(52) U.S. Cl. ........................ 711/108; 711/128; 711/154; 711/156; 365/49; 712/224; 712/300
(58) Field of Search ..................................... 711/108, 128, 711/156, 171, 172, 154; 365/49; 712/224, 300

(56) References Cited

U.S. PATENT DOCUMENTS

| | | | | |
|---|---|---|---|---|
| 5,440,715 | * | 8/1995 | Wyland | 711/108 |
| 5,649,149 | * | 7/1997 | Stormon et al. | 711/108 |
| 5,911,130 | * | 6/1999 | Shimizu et al. | 704/500 |

FOREIGN PATENT DOCUMENTS

| | | |
|---|---|---|
| 1-220293 | 9/1989 | (JP) . |
| 8-7580 | 1/1996 | (JP) . |
| 10-112728 | 4/1998 | (JP) . |

\* cited by examiner

*Primary Examiner*—Matthew Kim
*Assistant Examiner*—Matthew D. Anderson
(74) *Attorney, Agent, or Firm*—Foley & Lardner

(57) ABSTRACT

When one or more storage data are coincident with single search data (105), an associative memory with a shortest mask producing function carries out logical multiplication for all of mask information corresponding to the coincident storage data with a mask valid state as true. The result of logical multiplication is used as shortest mask information. In a primary searching operation, the associative memory with a shortest mask producing function is supplied with the search data (105) to provide the shortest mask information on shortest mask lines. Then, as a secondary searching operation, the shortest mask information thus extracted is used as the search data and supplied to the associative memory with a shortest mask producing function. Among the coincident storage data, only a mask match line connected to a particular word having mask information coincident with the shortest mask information is selected as the secondary search result. The associative memory is used in a network router, to calculate an optimum memory address signal (303) by encoding the selected mask match line. In response to the memory address signal (303), a memory data signal (305) enabling shortest network connection is produced as a transfer network address (313). The transfer network address (313) is combined with a data area (312) and a destination network address (311) contained in input transfer data (308) to produce output transfer data (309).

16 Claims, 13 Drawing Sheets

ASSOCIATIVE MEMORY HAVING A MASK FUNCTION FOR USE IN A NETWORK ROUTER

BACKGROUND OF THE INVENTION

This invention relates to a network system having a router using an associative memory and, in particular, to an associative memory having a mask function.

Referring to FIG. 1, a conventional computer network will be described. A user or a subscriber of the network has a connection apparatus, such as a computer terminal, for connection to the network. The connection apparatus (hereinafter referred to as a user's terminal) is assigned with a specific network address in accordance with a predetermined rule when it is connected to the network. Herein, the network address is represented by a numeral of a plurality of digits of, for example, first through fourth digits (a, b, c, d). The predetermined rule defines a hierarchical structure of the network address. For example, the first digit of the numeral represents a zone, such as Asia, America, and Europe. The second digit of the numeral represents a nation in the zone, such as China and Japan, if the zone is Asia. The third digit of the numeral represents a city in the nation, such as Beijing and Shanghai. In the following description, these hierarchical items will be called areas.

Referring to FIG. 1, each area is depicted by a rectangular block. Specifically, the network includes a first area (AREA1), a second area (AREA2), and a third area (AREA3) at a highest hierarchical level. The first area (AREA1) and the second area (AREA2) include a fourth area (AREA4) and a fifth area (AREA5), respectively. The fourth area (AREA4) and the fifth area (AREA5) include a sixth area (AREA6) and a seventh area (AREA7), respectively. A user's terminal (PC) 301-1 exists in the fifth area. The first area has a network address (1, *, *, *) in which a first digit alone is specified as "1". The fourth area subordinate to the first area has a network address (1, 2, *, *) in which first and second digits "1" and "2" are specified. The sixth area subordinate to the fourth area has a network address (1, 2, 2, *) in which first through third digits "1", "2", and "2" are specified. Thus, the user's terminal 301-1 in the sixth area has a specific or unique network address (1, 2, 2, 3). As will be understood from the above, a symbol "*" contained in these addresses represents "don't care".

In order to connect or establish communication between a plurality of user's terminals in the network, each area is provided with a network router (hereinafter simply called a router). As illustrated in the figure, the first through the seventh areas are provided with first through seventh routers 300-1 through 300-7, respectively. Each router is supplied from any user's terminal or any router connected to the router with transfer data and a transfer address annexed thereto. With reference to the transfer address and the relationship of connection of network apparatuses, the router calculates an optimum transfer route and transfers the transfer data via the optimum transfer route thus calculated.

The user's terminals are not directly connected by the use of the communication channels but carry out communication by controlling network connection by the use of communication control functions of the routers. Thus, communication channels as limited resources are saved.

Next referring to FIG. 2, the third router 300-3 will be described by way of example. Other routers have a similar structure.

The third router 300-3 memorizes, as address information or data, the network addresses for the areas except the third area to which the third router 300-3 belongs. Each digit of each network address is represented by a binary number of two bits. Thus, each network address is represented by a bit sequence of eight bits in total. For example, a network address (1, *, *, *) is represented by a bit sequence (01, 00, 00, 00). Since the symbol "*" represents "don't care" for each of second through fourth digits, it is necessary to indicate that the first and the second bits (01) in the bit sequence (01, 00, 00, 00) alone are valid and the remaining bits (00, 00, 00) are invalid. For this purpose, mask information (or mask data) is combined with the address information or data. In the illustrated example, the mask information (or mask data) is given by a bit sequence (00, 11, 11, 11). Herein, "0" and "1" represent a mask invalid state and a mask valid state, respectively. In the third router 300-3, the address information or data and the mask information or data are stored in an associative memory 100 with a mask function, as illustrated in FIG. 2.

Herein, a typical associative memory with a mask function (hereinafter simply called a mask associative memory) will be described. The mask associative memory can store mask information or data for every single word or every plural words of storage data (namely, the address data). As disclosed in Japanese Unexamined Patent Publication (JP-A) No. 1-220293 (220293/1989), the associative memory has a search (or retrieving) function or a mask searching function in addition to write/read functions of writing and reading storage data at a designated memory address in the manner similar to an ordinary memory circuit. The searching function is for searching same storage data exactly coincident with input search or retrieval data to provide a memory address of the same storage data as a search result. The mask searching function is for searching similar storage data partially coincident with the input search data to provide a memory address of the similar storage data as a search result. Herein, a part of the storage data is excluded from comparison by the use of the mask information.

Referring to FIG. 3, the n-bit/m-word associative memory 100 has first through m-th data word lines 102-1 through 102-m and first through m-th mask word lines 103-1 through 103-m both as input signal lines, first through m-th word match lines 104-1 through 104-m as output signal lines, and first through n-th bit lines 101-1 through 101-n as input/output signal lines. The associative memory 100 comprises first through m-th associative memory words 106-1 through 106-m. Each of the first through the m-th associative memory words 106-1 through 106-m is connected to the first through the n-th bit lines 101-1 through 101-n. Each of the associative memory words 106 (suffixes omitted) is connected to a corresponding one of the data word lines 102 (suffixes omitted) and a corresponding one of the mask word lines 103 (suffixes omitted) both as input lines and to a corresponding one of the word match lines 104 (suffixes omitted) as an output line. For example, the first associative memory word 106-1 is connected to the first data word line 102-1 and the first mask word line 103-1 as the input lines and to the first word match line 104-1 as the output line.

Upon carrying out a writing operation, the first through the n-th bit lines 101-1 through 101-n are supplied from an external source with write data to be written into data cells or mask cells in a desired one of the associative memory words 106. Upon carrying out a reading operation, read data are supplied from the data cells to the first through the n-th bit lines 101-1 through 101-n. In order to write or read the data into and from the data cells, a selected one of the first through the m-th data word lines is activated (active or valid state). Then, a corresponding one of the associative memory words 106 is supplied with the write data on the first through the n-th bit lines 101-1 through 101-n. Alternatively, the read data are supplied from the corresponding associative memory word 106 to the first through the n-th bit lines 101-1 through 101-n. For the mask cells, a similar operation is carried out except that the mask word lines 103 are controlled instead of the data word lines 102. In the following description, the data memorized or to be memorized in the data cells will be referred to as storage data while the data memorized or to be memorized in the mask cell will be referred to as mask storage data.

Upon carrying out a searching operation, search data 105 are supplied from an external source to the bit lines 101. During the searching operation, all of the data word lines 102 and the mask word line 103 are inactivated (invalid state). Each of the word match line 104 is activated (valid state) when all bits of the search data 105 delivered to the bit lines 101-1 through 101-n upon the searching operation are coincident with all bits of the storage data stored in a corresponding one of the associative memory words 106. In case of the mask searching operation, the word match line 104 is activated (valid state) when the search data 105 on the bit lines 101 are partially coincident with the storage data with a part of the storage data excluded from comparison by the use of the mask information or data. Otherwise, the word match line 104 is inactivated (invalid state). Herein, a valid state and an invalid state of the word match line 104 are represented by "1" and "0", respectively.

Each of the first through the m-th associative memory words 106-1 through 106-m comprises a plurality of associative memory cells 107, n in number. For example, the first associative memory words 106-1 comprises first through n-th associative memory cells 107-1-1 through 107-1-n. All of the first through the n-th associative memory cells 107 of each associative memory word 106 are connected to a corresponding one of the data word lines 102 and a corresponding one of the mask word lines 103 both as data input lines. For example, the first through the n-th associative memory cells 107-1-1 through 107-1-n of the first associative memory word 106-1 are connected to the first data word line 102-1 and the first mask word line 103-1.

The first through the n-th associative memory cells 107 of each of the associative memory words 106 are connected in one-to-one correspondence to the first through the n-th bit lines 101 as data input/output lines. For example, the first associative memory cell 107-1-1 of the first associative memory word 106-1 is connected to the first bit line 101-1.

All of the first through the n-th associative memory cells 107 of each of the associative memory words 106 are connected to a corresponding one of the word match lines 104 by wired logic connection in the example being illustrated in FIG. 3. For example, the first through the n-th associative memory cells 107-1-1 through 107-1-n of the first associative memory word 106-1 are connected to the first word match line 104-1 by the wired logic connection.

Each of the associative memory cells 107 comprises a data cell 108, a comparator 109, and a mask cell 110. The data cell 108 stores as the storage data the write data on a corresponding one of the bit lines 101 or supplies the storage data stored therein to the corresponding bit line 101 when a corresponding one of the data word lines 102 is in a valid state. When the corresponding data word line 102 is in an invalid state, no operation is performed for the corresponding bit line 101. Irrespective of the state of the corresponding data word line 102, the storage data stored therein are supplied to the comparator 109.

When a corresponding one of the mask word lines 103 is in a valid state, the mask cell 110 stores as the mask information the write data on the corresponding bit line 101 or supplies the mask information stored therein to the corresponding bit line 101. When the corresponding mask word line 103 is in an invalid state, no operation is performed for the corresponding bit line 101. Irrespective of the state of the corresponding mask word line 103, the mask information stored therein is delivered to the comparator 109.

The comparator 109 is supplied with the value on the corresponding bit line 101, the storage data in the data cell 108, and the mask information in the mask cell 110. When the mask information is in a valid state or when the value on the corresponding bit line 101 and the storage data in the data cell 108 are coincident with each other, the word match line 104 is put into an opened state. Otherwise, the comparator 109 puts the word match line 104 into an invalid state "0".

Prior to the start of the searching operation, the word match line 104 is precharged to a high level or pulled up by a resistor (not shown) to be put into a valid state "1". After the searching operation is started, the word match line 104 and the associative memory cell 107 performs the wired logic so that the word match line 104 is put into a valid state "1" when all of the associative memory cells 107 in the same associative memory word 106 produce a coincidence state and that the word match line 104 is put into an invalid state "0" when any one of the associative memory cells 107 produces an incoincidence state. Alternatively, an ordinary logical gate may be used as far as the similar operation is performed.

Next, the operation will be described. When the writing or the reading operation is performed, the operation is quite similar to that of the ordinary memory circuit. In the reading operation, the write data are not supplied to the bit lines 101-1 through 101-n but a valid state is supplied to a desired one of the data word lines 102-1 through 102-m or a desired one of the mask word lines 103-1 through 103-m while an invalid state is supplied to the remaining ones. At this time, if one of the data word lines 102 is put into a valid state, the storage data stored in a corresponding one of the associative memory words 106 are supplied to the bit lines 101-1 through 101-n. If one of the mask word lines 103 is put into a valid state, the mask information stored in a corresponding one of the associative memory words 106 is supplied to the bit lines 101-1 through 101-n.

In the writing operation, the write data are supplied to the bit lines 101-1 through 101-n. A desired one of the data word lines 102-1 through 102-m or a desired one of the mask word lines 103-1 through 103-m is put into a valid state while the remaining ones are put into an invalid state. At this time, the values on the bit lines 101-1 through 101-n are stored as the storage data in the data cells 108 of one of the associative memory words 106 corresponding to the above-mentioned one of the data word lines 102-1 through 102-m which is put into a valid state. Alternatively, the values on the bit lines 101-1 through 101-n are stored as the mask information in the mask cells 110 of one of the associative memory words 106 corresponding to the above-mentioned one of the mask word lines 103-1 through 103-m which is put into a valid state.

Prior to the start of the searching operation, the word match line 104 is precharged to the high level or pulled up by the resistor (not shown) to be put into a valid state "1", as described above.

Upon the searching operation, the search data 105 are supplied to the bit lines 101-1 through 101-n while all of the data word lines 102-1 through 102-m and all of the mask word lines 103-1 through 103-m are supplied with an invalid state. In each of the associate memory cells 107, the comparator 109 compares the value of the corresponding bit line 101 and the storage data stored in the data cell 108. Upon coincidence, the word match line 104 in the same associative memory word 106 is put into the opened state. Upon incoincidence, the word match line 104 is put into the opened state if the mask information stored in the mask cell 110 of the same associative memory cell 107 is in a valid state. Otherwise, the comparator 109 produces an invalid state "0". Thus, as far as the mask information in the mask cell 110 is kept in a valid state, the storage data stored in the data cell 108 can be excluded from the comparison in the searching operation. The word match line 104 in each associative memory word 106 is put into a valid state when all of the first through the n-th comparators 109 therein render the word match line 104 in the opened state. The word match line 104 is put into an invalid state "0" when at least one of the comparators 109 produces an invalid state. Therefore, if the storage data stored in one of the associative memory words 106 are coincident with the bit lines 101 except those bits excluded by the mask information, the word match line 104 produces a valid state "1". If at least one bit is incoincident, the word match line 104 produces an invalid state "0". It will therefore be understood that, after completion of the searching operation, the same or the similar storage data completely or partially coincident with the search data 105 are stored in one of the associative memory words 106-1 through 106-m which corresponds to a valid-state one of the word match lines 104-1 through 104-m.

The output signals of the word match lines 104-1 through 104-m can directly be used or may be encoded by an encoder to produce address signals for write and read operations in a different memory device. If a valid state is produced from a plurality of ones of the word match lines 104-1 through 104-m greater in number than the address signals to be produced, it is necessary to select ones of the word match lines 104-1 through 104-m for use in generation of the address signals by means of a priority encoder. In order to determine the priority, use is typically made of an ascending or a descending order of the addresses.

Next referring to FIG. 4, the associative memory cell 107 will be described. Two bit lines 101a and 101b correspond to each bit line 101 illustrated in FIG. 3. In FIG. 3, these bit lines 101a and 101b are collectively represented by each single bit line 101-i. Through the two bit lines 101a and 101b, writing and reading of the data into and from the memory cell and the input of the search data 105 are carried out. Upon writing the data or the input of the search data 105, the bit line 101b is supplied with an inverted value of a value on the bit line 101a. The data cell 108 is a typical SRAM (Static Random Access Memory) comprising inverted logical gates (G1 and G2) 201 and 202 with one's input and output terminals connected to the other's output and input terminals, respectively, a MOS (Metal Oxide Semiconductor) transistor (T1) 203 connecting the output terminal of the inverted logical gate (G2) 202 to the bit line 101a and rendered conductive when the data word line 102 has a high level, and a MOS transistor (T2) 204 connecting the output terminal of the inverted logical gate (G1) 201 to the bit line 101b and rendered conductive when the data word line 102 has the high level.

The mask cell 110 is also a typical SRAM comprising inverted logical gates (G3 and G4) 209 and 210 with one's input and output terminals connected to the other's output and input terminals, respectively, a MOS transistor (T7) 211 connecting the output terminal of the inverted logical gate (G4) 210 to the bit line 101a rendered conductive when the mask word line 103 has a high level, and a MOS transistor (T8) 212 connecting the output terminal of the inverted logical gate (G3) 209 to the bit line 101b and rendered conductive when the mask word line 103 has the high level.

The comparator 109 comprises a MOS transistor (T3) 205, a MOS transistor (T4) 206, a MOS transistor (T5) 207, and a MOS transistor (T6) 208. The MOS transistor (T3) 205 and the MOS transistor (T4) 206 are inserted between the bit lines 101a and 101b in cascade. The MOS transistor (T3) 205 is rendered conductive when the inverted logical gate (G1) 201 in the data cell 108 produces an output of a high level. The MOS transistor (T4) 206 is rendered conductive when the inverted logical gate (G2) 202 in the data cell 108 produces an output of a high level. The MOS transistor (T5) 207 and the MOS transistor (T6) 208 are connected between a low potential and the word match line 104 in cascade. The MOS transistor (T5) 207 is rendered conductive when a junction or node of the MOS transistor (T3) 205 and the MOS transistor (T4) 206 has a potential of a high level. The MOS transistor (T6) 208 is rendered conductive when the inverted logical gate (G3) 209 in the mask cell 110 produces an output of a high level. When both the bit line 101a and the inverted logical gate (G1) 201 produce outputs of a high level or when both the bit line 101b and the inverted logical gate (G2) 202 produce outputs of a high level, the junction of the MOS transistor (T3) 205 and the MOS transistor (T4) 206 has a high level to render the MOS transistor (T5) 207 conductive.

Therefore, when the storage data stored in the data cell 108 and the search data 105 on the bit lines 101a and 101b are different from each other, the MOS transistor (T5) 207 is rendered conductive. The MOS transistor (T6) 208 is put into an opened state and a conductive state when the mask information stored in the mask cell 110 is "1" and "0", respectively. The word match line 104 is pulled up to a high potential by the resistor (not shown) or precharged to a high potential prior to the start of the searching operation. This provides the wired AND connection such that, when a plurality of the associative memory cells 107 are connected to the word match line 104 through the MOS transistors (T6) 208, the word match line 104 is given a low level if at least one associative memory cell 107 produces an output of a low level.

When both the MOS transistor (T5) 207 and the MOS transistor (T6) 208 are conductive, the associative memory cell 107 supplied an invalid state "0" to the word match line 104. Otherwise, the word match line 104 is put into an opened state. Specifically, when the mask information is "0", the word match line 104 is put into an opened state. When the mask information is "1", the word match line 104 is put into an opened state and supplied with an invalid state "0" when the search data 105 on the bit lines 101a and 101b and the storage data stored in the data cell 108 are coincident with each other and different from each other, respectively.

Now, description will be turned back to the router illustrated in FIG. 2. As described above, the conventional mask associative memory disregards those portions "*" representing "don't care" upon comparison between the search data and the storage data. Therefore, a plurality of word match lines 104 may sometimes be put into a valid state. Under the circumstances, in order to produce the address signal for write and read operations in another memory device by the use of the search result of the associative memory, it is necessary to preferentially select one of the word match lines 104 in a valid state and to produce a destination address for a selected one of the word match lines 104.

For this purpose, the router is provided with a priority encoder 302 as illustrated in FIG. 2. When a plurality of the word match lines 104 are in a valid state, one of those word match lines 104 is selected. Then, an encoding operation is carried out for the selected one of the word match lines 104 to produce an encoded result which is delivered as a memory address signal 303 to a memory 304. It is assumed here that, among the word match lines 104-1 through 104-5 in a valid state, a particular one having a greater address is preferentially selected.

On the other hand, the memory 304 stores router addresses of the routers 300 corresponding to the network addresses each of which comprises the address information and the mask information and each of which is stored in each word of the associative memory 100. In the memory 304, each router address is memorized in a word corresponding to that of the associative memory 100 where a corresponding network address is memorized. For example, the network address (1, *, *, *) is stored in the word 1 of the associative memory 100 while the router address of the router 300-1 (FIG. 1) corresponding thereto is stored in the word 1 of the memory 304. Similarly, the address of the router 300-2 and the address of the router 300-6 are stored in the word 2 and word 3 of the memory 304, respectively. Supplied with the memory address signal 303 as a read address, the memory 304 produces a memory data signal 305 containing storage data designated by the memory address signal 303.

Although not illustrated in the figure, each router has a CPU for controlling the above-mentioned operation of the router.

In FIGS. 1 and 2, description will be made about a connecting operation in the conventional network controlled by the routers. It is assumed here that the transfer data supplied to the router 300-3 have a destination address (2, 2, 1, 1). As a result of search by the associative memory 100, (2, *, *, *) in the word 2 alone is coincident so that the word match line 104-2 alone is put into a valid state. The priority encoder 302 produces "2" as the memory address signal 303. In response to the memory address signal 303, the memory 304 produces as the memory data signal 305 the network address of the router 300-2. Consequently, the router 300-3 transfers the transfer data having the destination address (2, 2, 1, 1) to the router 300-2. The router 300-2 is responsive to the transfer data and performs the operation similar to that mentioned above. Thus, the transfer data are successively transferred from router to router until the user's terminal at the destination address (2, 2, 1, 1) is reached.

When a plurality of the storage data are coincident with the single search data in the searching operation by the above-mentioned associative memory, all of the word match lines corresponding to those coincident storage data are activated. In order to select one of the word match lines, the priority encoder 302 is required as described in the foregoing.

However, even if one of the word match lines is selected by the priority encoder, it is uncertain whether or not the selected one is an optimum one. For example, it is assumed that the transfer data supplied to the router 300-3 has a destination at the user's terminal (PC) 301-1, i.e., a destination address (1, 2, 2, 3). If the search is carried out by the conventional associative memory 100, (1, *, *, *), (1, 2, 2, *) and (1, 2, *, *) in the word 1, the word 3, and the word 4 are coincident so that the word match lines 104-1, 104-3, and 104-4 are put into a valid state. Herein, the priority encoder 302 produces "4" as the memory address signal 303 because the greater address has a higher priority. That is, the word 4 has the greater address than the word 3. Therefore, the memory 304 produces as the memory data signal 305 the network address of the router 300-4. As a result, the router 300-3 transfers the transfer data having the destination address (1, 2, 2, 3) to the router 300-4.

However, as readily understood from FIG. 1, transfer to the router 300-6 rather than to the router 300-4 provides a shorter route to the user's terminal (PC) 301-1 and is therefore optimum. Thus, it is optimum to select a particular router with the least number of valid bits of the mask information. In case where the conventional associative memory 100 is used in calculating the transfer network address from router to router, selection of one of the routers 300-1, 300-4, and 300-6 as a transfer route is dependent upon the priority which is determined by the order of storage in the associative memory 100 in this example. Thus, it is not assured that the optimum transfer route is selected.

Taking the above into consideration, the CPU contained in the conventional router is loaded with a program for calculating an optimum transfer address. Under control of the program, the optimum address is calculated on the software. It is noted here that the router connected to the internet must deal with network connection information in an amount of more than several tens of thousands of words. Therefore, calculation of the transfer network address by the software requires more than several hundreds of clocks. This is a main factor of occurrence of a large delay in data transfer by the internet.

In the meanwhile, registration and cancellation of users or subscribers of the network are very frequent. The update of the network addresses following the registration and the cancellation of the users must be reflected in the associative memory of the router. For this purpose, the routers communicate with one another at a predetermined time instant to exchange the address information of the users so that the associative memory is automatically updated with the latest network addresses. The above-mentioned exchange of the address information is performed sorting the order of storage of the words in the associative memory in order to achieve the shortest communication routes among the users. However, such sorting takes a long time because the users increase in number from year to year. Therefore, the network inevitably becomes uncommunicable for several tens of seconds.

Furthermore, the router requires the priority encoder which is increased in size in correspondence to the priority function.

SUMMARY OF THE INVENTION

It is therefore an object of this invention to provide an associative memory which is capable of quickly selecting an optimum one of a plurality of storage data coincident with search data to produce an output representative of the optimum one.

It is another object of this invention to provide a router which does not require a priority encoder.

It is still another object of this invention to provide a network system which is capable of transferring data at a high speed.

According to a first aspect of this invention, there is provided an associative memory comprising means for storing a plurality of associative memory words, each of which is a pair of storage data and mask data, and means for carrying out, when at least two words are selected as selected words in a primary searching operation with respect to external search data, a logical operation of those mask data corresponding to the selected words.

Specifically, the mask data are defined by logical values of "1" and "0". When a plurality of match lines are put into a valid state, logical multiplication is carried out bit by bit for those mask data (or information) stored in associative memory words connected to the valid-state match lines. As a result, among those mask information corresponding to the coincident storage data, shortest mask information with a least number of bits in a mask valid state ("1") is obtained.

Among those mask data stored in the associative memory words connected to the valid-state match lines, a particular one having a bit sequence identical with that of the shortest mask information is retrieved. It is thus possible to select a particular one of the selected storage data which corresponds to the particular mask data having the least number of bits in a mask valid state.

According to a second aspect of this invention, an associative memory of the first aspect is characterized by a secondary searching operation of searching, among those mask data corresponding to the selected storage data, a particular one of the mask data coincident with the result of the logical operation as secondary search data to select a particular one of the associative memory words storing the particular mask data.

According to a third aspect of this invention, an associative memory of the first aspect is characterized by a secondary searching operation of searching the mask data stored in the associative memory words with the result of the logical operation used as secondary search data to select a particular one of the associative memory words which is selected in the primary searching operation and which stores a particular one of the mask data coincident with the result of the logical operation in the secondary searching operation.

According to a fourth aspect of this invention, an associative memory of any one of the first through the third aspects is characterized in that the above-mentioned logical operation is a logical multiplication.

According to a fifth aspect of this invention, there is provided an associative memory comprising a first associative memory having a plurality of first words each of which stores a pair of object data and mask data, the first associative memory comprising means for carrying out, when at least two of the first words are selected as selected first words as a result of a searching operation for external search data, a logical operation of those mask data corresponding to the selected first words; and a second associative memory having a plurality of second words each of which stores a pair of object data and mask data. Each of the second words comprises a plurality of bits twice in number than the first words in the first associative memory. Each of the second words of the second associative memory has a first bit group storing the object data and the mask data stored in the first word of the first associative memory at corresponding addresses, and a second bit group storing the mask data stored in the first bit group of the same second word. In the searching operation, the result of the logical operation is supplied to the second bit group of the second associative memory and the search data are supplied to the first bit group of the second associative memory. Among the object data in the second words of the second associative memory, selection is made of a particular one of the second words storing the object data and the mask data coincident in bit information with the search data and the result of the logical operation, respectively.

According to a sixth aspect of this invention, there is provided an associative memory storing mask information for every single word of storage information to indicate a valid state or an invalid state representative of whether or not every single bit or every plural bits of the storage information should be excluded from a search object, the associative memory comprising first searching means for selecting, among all of those mask information corresponding to one or more storage information coincident with the search data, a particular mask information as a shortest mask information by which a least number of bits of the storage information are excluded from the search object and for delivering the shortest mask information to a shortest mask signal line, and second searching means for producing an identification signal for identifying, among the one or more storage information coincident with the search data, a particular storage information corresponding to the particular mask information coincident with the shortest mask signal line.

According to a seventh aspect of this invention, an associative memory of the sixth aspect is characterized in that the first searching means comprises an associative memory with a shortest mask producing function which has for each word of the storage information a match line to be put into a valid state when the search data and the storage data with the mask information added are coincident with each other and which has a shortest mask calculation circuit for calculating, when at least one storage information is coincident with the search data, a logical product for all of those mask information corresponding to the coincident storage data with a mask valid state as true to supply the logical product to a shortest mask signal line.

According to an eighth aspect of this invention, an associative memory of the sixth aspect is characterized in that the second searching means comprises a conventional associative memory storing in a single word a combination of the storage information and the mask information as a search object. The conventional associated memory is supplied with a combination of the search data supplied to the first searching means and the shortest mask signal produced by the first searching means as search data of a single word.

According to a ninth aspect of this invention, an associative memory with a shortest mask producing function of the seventh aspect is characterized by comprising a shortest mask producing circuit composed of a first logical circuit for producing a mask invalid state for every single bit of the mask information in a single word when the match line corresponding to the single word is in a valid state and the bit of the mask information is in an invalid state, and a second logical circuit supplied from the first logical circuit with the states of the mask information of all words at a same bit position for carrying out logical multiplication with the mask valid state as true to deliver the result of logical multiplication to a shortest mask signal line at the corresponding bit position.

According to a tenth aspect of this invention, an associated memory of the ninth aspect is characterized in that the second logical circuit comprises a wired logic in which the outputs of the first logical circuit for corresponding bits of the mask information of all words at the same bit position are connected to the shortest mask output line at the same bit position.

According to an eleventh aspect of this invention, an associated memory with a shortest mask producing function of the ninth aspect is characterized in that the first logical circuit has first and second transistors inserted in cascade between the shortest mask signal line at the corresponding bit position and a mask invalid state potential for each single bit of the mask information of one word. The first MOS transistor is put into a conductive state and an opened state when the match line corresponding to the word is in a valid state and an invalid state, respectively. The second MOS transistor is put into a conductive state and an opened state when a bit of the mask information is in an invalid state and a valid state, respectively.

According to a twelfth aspect of this invention, an associative memory of the sixth aspect is characterized in that the first searching means comprises first memory means for storing shortest mask signal search data and coincidence detecting means for comparing storage information in the first memory means and mask information combined with storage information coincident with external search information to supply a second match line with the result of comparison, so that the first and the second searching means share their components with each other.

According to a thirteenth aspect of this invention, an associative memory of the twelfth aspect is characterized in that the coincidence detecting means comprises selecting means for selecting either the external search information or an output signal of the first memory means as input search data, second memory means for storing word by word the value on the match line corresponding to every single word, and comparing means for supplying the second match line with a valid state when coincidence is detected as a result of comparison between the mask information and the search data for each single word and when the stored state in the second memory means in the word is a valid state.

According to a fourteenth aspect of this invention, an associative memory of the thirteenth aspect is characterized in that the comparing means comprises mask comparing means for supplying the second match line with an invalid state when incoincidence is detected as a result of comparison between the mask information and the search data for every single bit of the mask information in a single word, and second memory means in the single word for supplying the second match line with an invalid state when the stored state is an invalid state.

According to fifteenth aspect of this invention, an associative memory of the fourteenth aspect is characterized in that the comparing means forms a wired logic by connecting outputs of the mask comparing means and the second memory means to the second match line.

According to a sixteenth aspect of this invention, there is provided a searching method for searching storage information combined per every single word with mask information to indicate by a valid state or an invalid state whether or not a single bit or plural bits of the storage information are to be excluded from a search object, the method comprising the steps of:

producing, when one or more storage information is coincident with search data, a shortest mask signal representative of a particular mask information which is selected from those mask information corresponding to the one or more storage information coincident with the search data and which corresponds to a particular storage information with a least number of bits excluded from the search object, and producing an identification signal for identifying, among the one or more storage information coincident with the search data, the particular storage information corresponding to the particular mask information coincident with the shortest mask signal.

According to a seventeenth aspect of this invention, a searching method of the sixteenth aspect is characterized by the step of producing, when one or more storage information are coincident with the search data, a shortest mask signal representative of a result of logical multiplication for all of the mask information corresponding to the coincident storage information with the mask valid state as true.

According to an eighteenth aspect of this invention, there is provided a router having an associative memory which stores storage information and mask information combined with every single word of the storage information to indicate by a valid state and an invalid state whether or not a single bit or plural bits of the storage information are to be excluded from a search object and which stores routing information, the router comprising:

first searching means for supplying, when one or more routing information is coincident with a destination network address of input transfer data, a shortest mask signal line with a particular mask information which is selected from all of the mask information corresponding to the routing information coincident with the destination network address and which corresponds to a particular routing information with a least number of bits to be excluded from the search object, second searching means for producing a coincidence signal identifying, among one or more routing information coincident with the destination network address, the particular routing information corresponding to the particular mask information coincident with the shortest mask signal line, means responsive to the coincidence signal for determining a transfer address of the input transfer data, and means for transferring the input transfer data to the transfer address.

According to a nineteenth aspect of this invention, there is provided a router having a routing information table which stores a plurality of routing information and mask information combined with every single word of the routing information to indicate by a valid state and an invalid state whether or not a single bit or plural bits are to be excluded from a search object, the router carrying out the steps of:

producing, when one or more routing information is coincident with a destination network address of input transfer data, a shortest mask signal representative of a particular mask information which is selected from all of the mask information corresponding to the routing information coincident with the destination network address and which corresponds to a particular routing information with a least number of bits to be excluded from the search object, producing a coincidence signal identifying, among one or more routing information coincident with the destination network address, the particular routing information corresponding to the particular mask information coincident with the shortest mask signal, p1 determining a transfer address of the input transfer data in response to the coincidence signal, and transferring the input transfer data to the transfer address.

According to a twentieth aspect of this invention, there is provided a network system in which data communication is carried out among apparatuses connected to the network via routers of the eighteenth or the nineteenth aspect.

DESCRIPTION OF THE PREFERRED EMBODIMENTS

Figure 1:
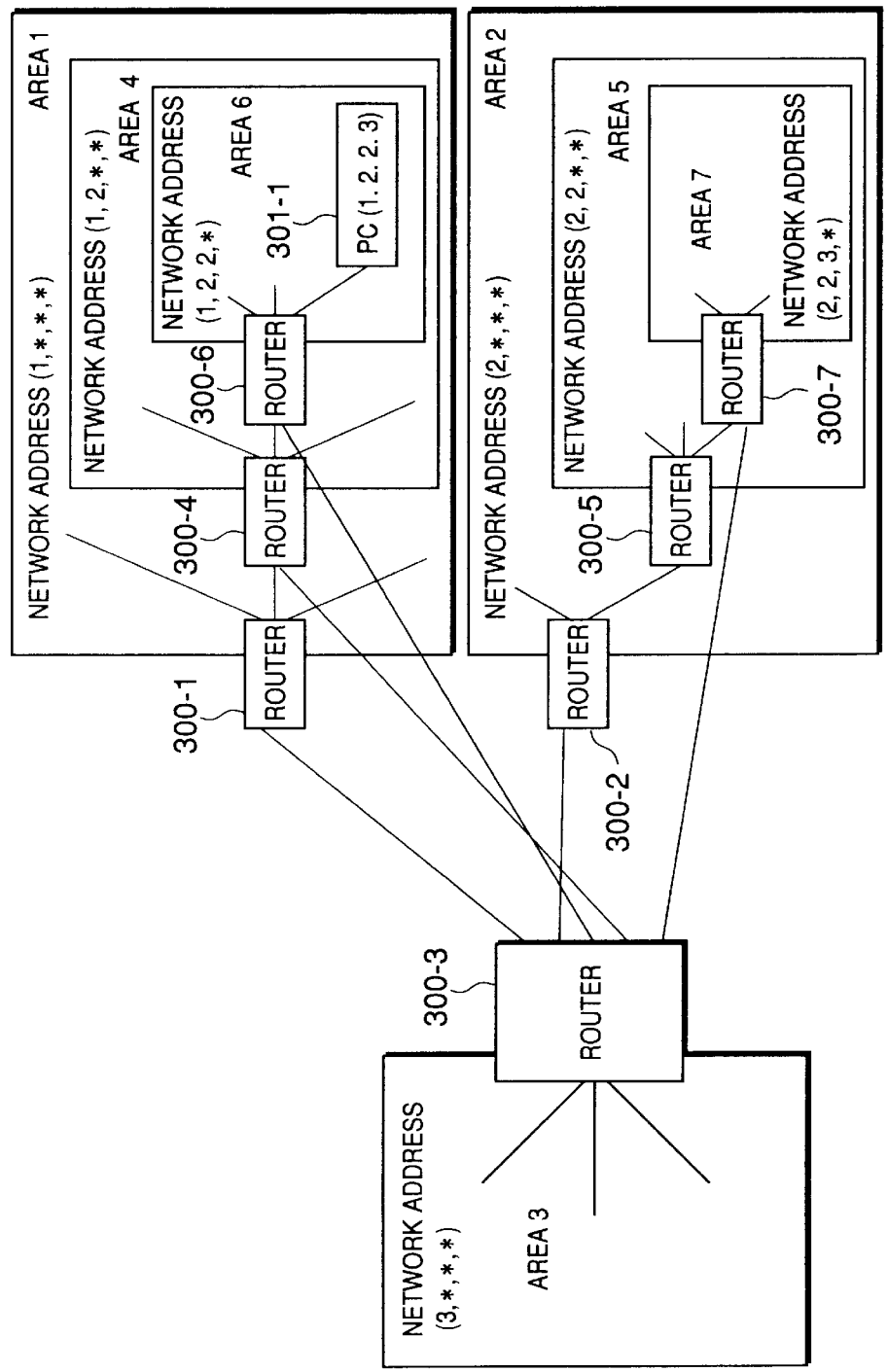
FIG. 1 schematically shows a typical network system.

Now, description will be made in detail about several preferred embodiments of the present invention with reference to the drawing.

Figure 5:
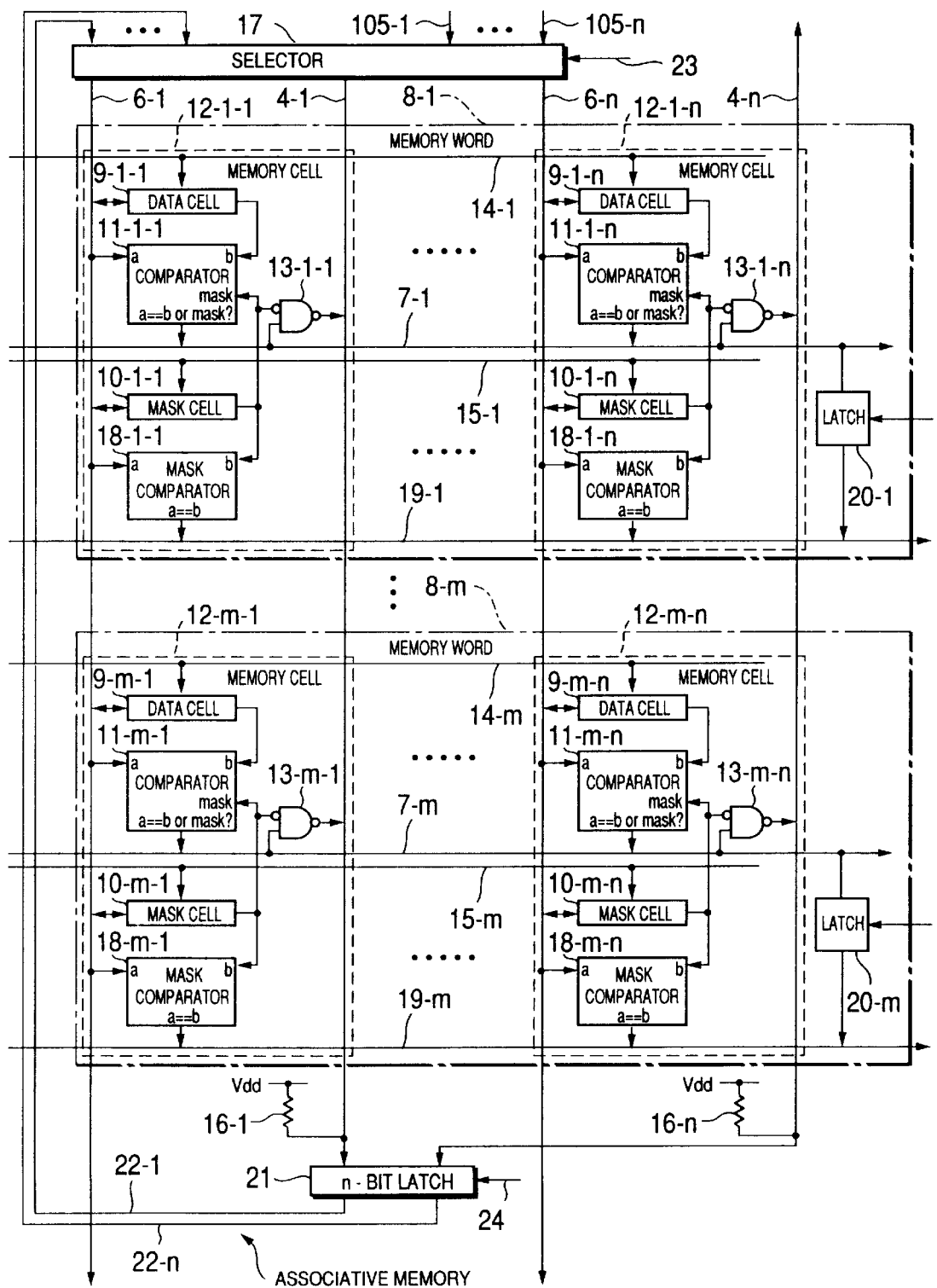
FIG. 5 is a block diagram of an associative memory according to a first embodiment of this invention.

Referring to FIG. 5, a first associative memory 1 with a shortest mask producing function (hereinafter will simply be referred to as an associative memory) according to a first embodiment of this invention comprises a two-input/one-output n-bit selector 17, first through m-th n-bit associative memory word, and an n-bit latch 21. Each associative memory word 8-j (where j is an integer variable between 1 and m, both inclusive) comprises first through n-th associative memory cells 12-j-1 through 12-j-n and a latch 20-j.

Each associative memory cell 12-j-k (where k is another integer variable between 1 and n, both inclusive) comprises a data cell 9-j-k, a comparator 11-j-k, a mask cell 10-j-k, a mask comparator 18-j-k, and a logical gate 13-j-k. The data cell 9-j-k is for storing "data" bit information at a corresponding bit of storage data supplied from an external source through a bit line 6-k. The comparator 11-j-k is for comparing the "data" bit information memorized in the data cell 9-j-k and "search" bit information 105-k at a corresponding bit of search data supplied from the external source. The mask cell 10-j-k is for storing "mask" bit information of a corresponding bit of mask information supplied from the external source through the bit line 6-k. The mask comparator 18-j-k is for comparing the "mask" bit information memorized in the mask cell 10-j-k and "shortest mask" bit information 22-k at a corresponding bit of shortest mask information produced from the n-bit latch 21.

Figure 3:
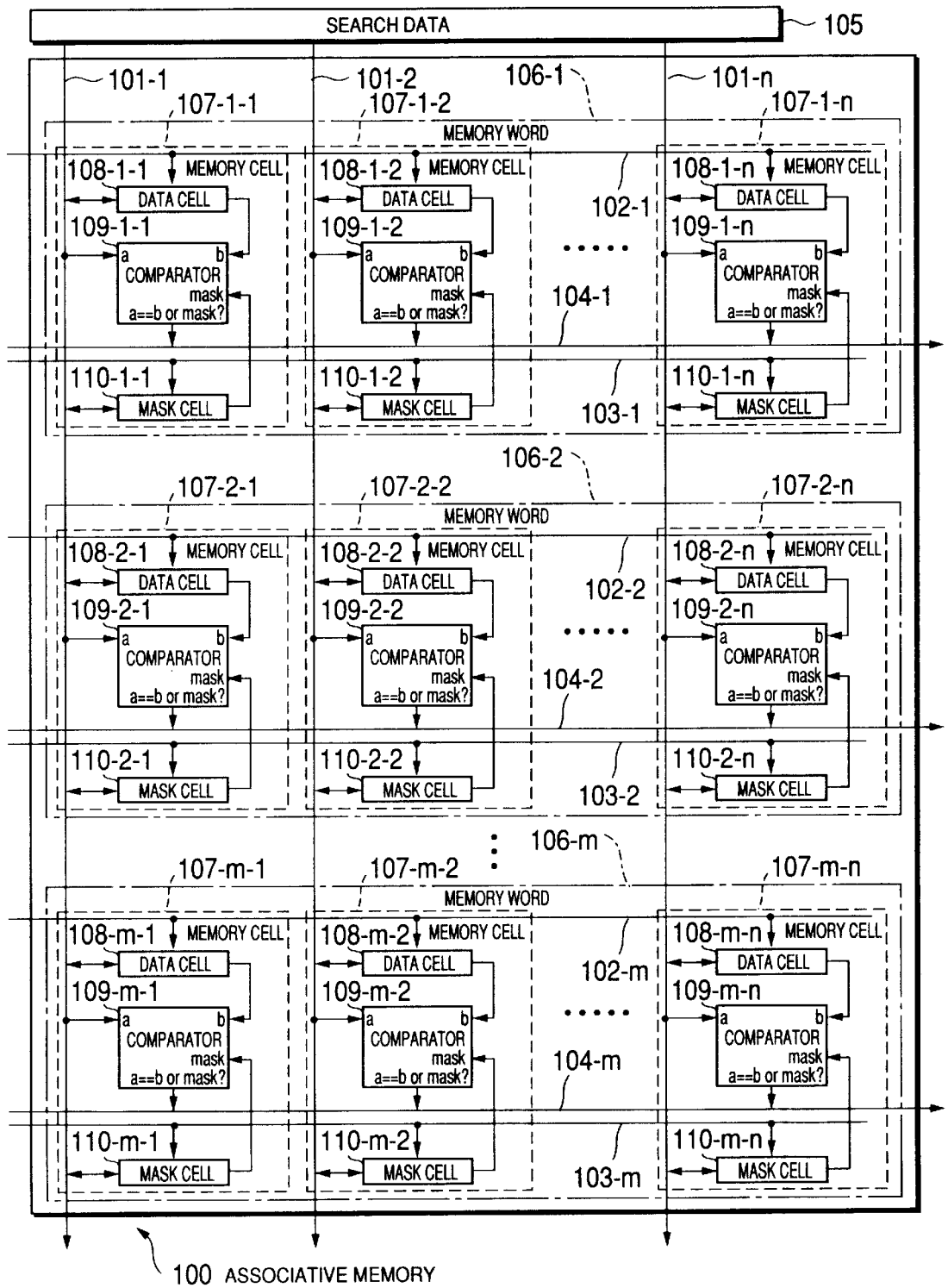
FIG. 3 is a block diagram of a conventional associative memory.
Figure 4:
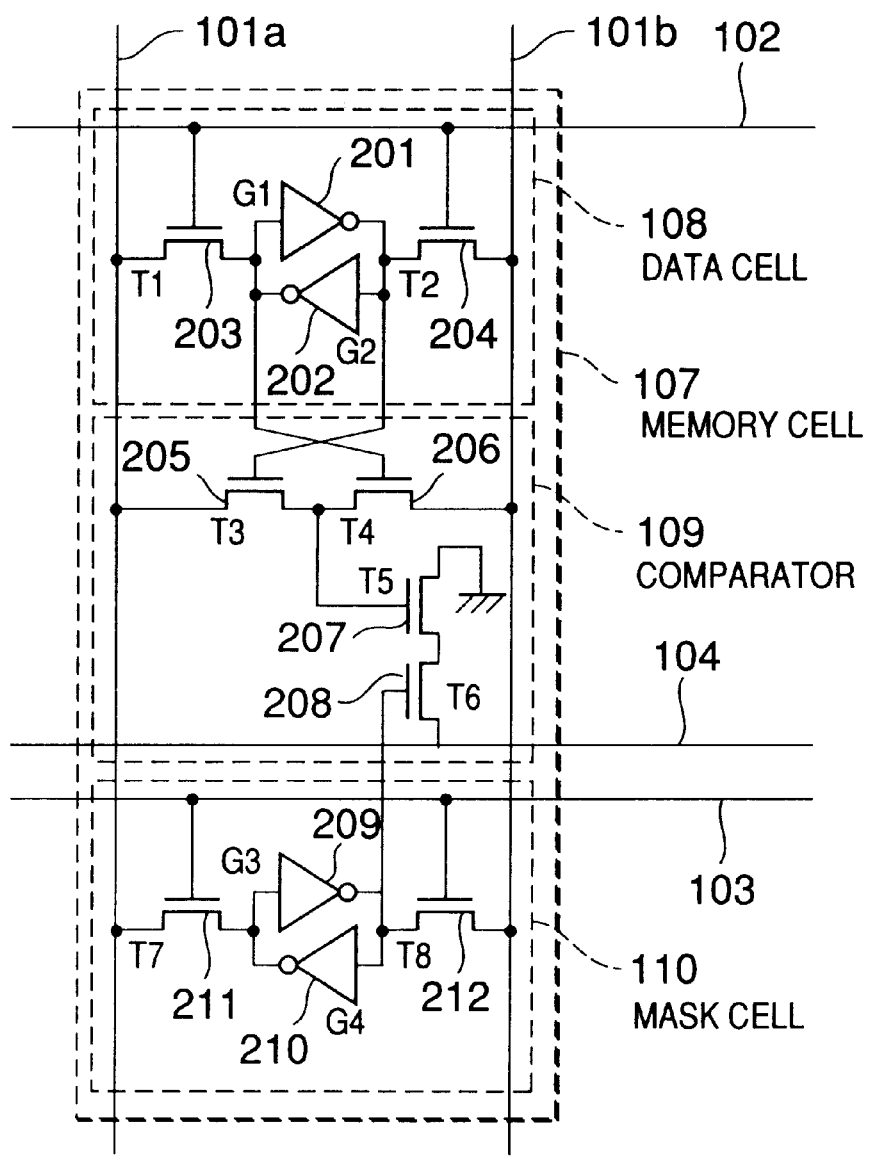
FIG. 4 is a circuit diagram of an associative memory cell illustrated in FIG. 3.
Figure 6:
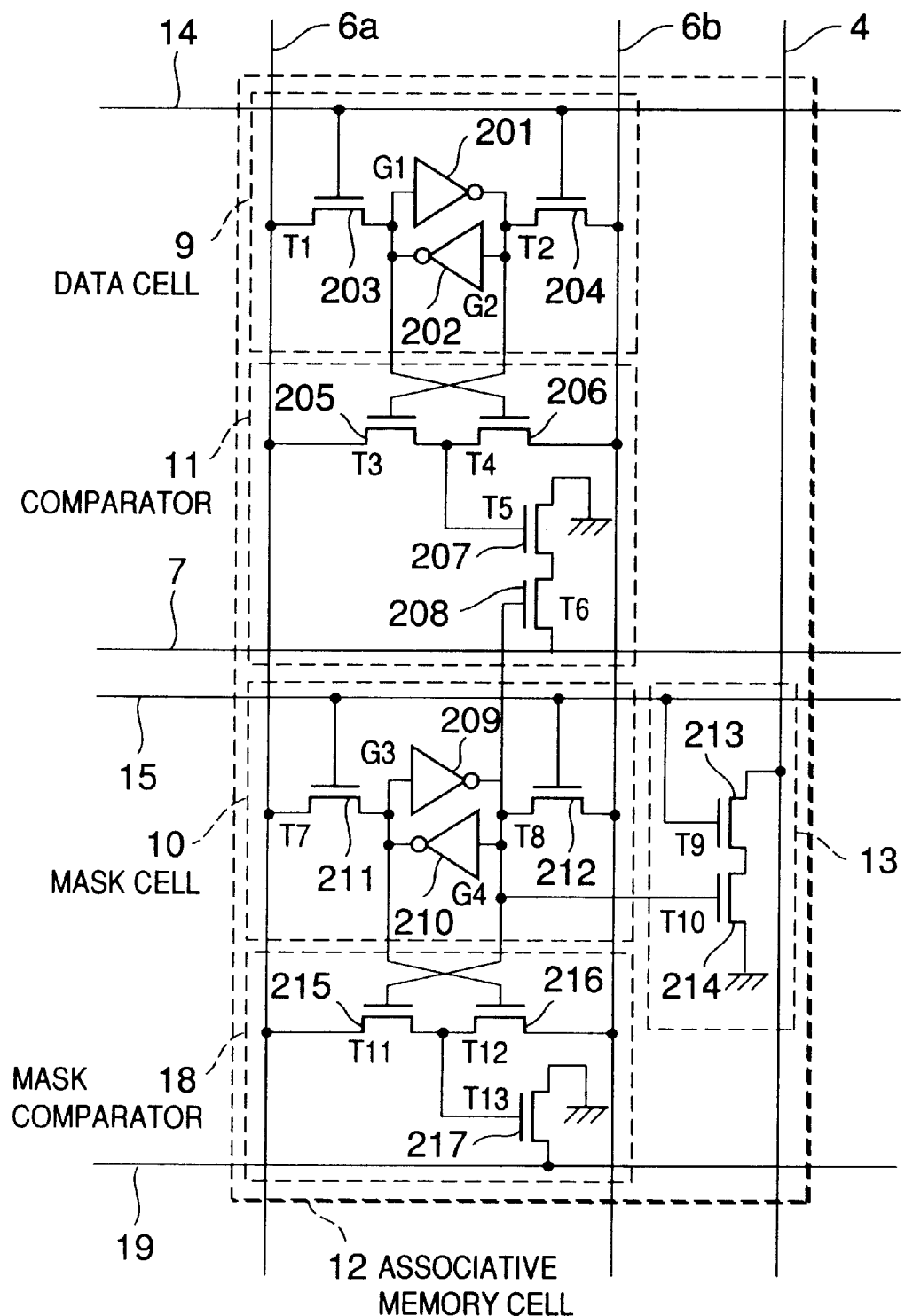
FIG. 6 shows an associative memory cell illustrated in FIG. 5.

Next referring to FIG. 6, each associative memory cell 12 (suffix omitted) is similar to the conventional associative memory cell illustrated in FIG. 3 except that each associative memory cell 12 of FIG. 6 includes the mask comparator 18, the logical gate 13, a mask match line 19, and a shortest mask line 4.

Therefore, description will be directed only to those components different from the conventional associative memory cell. At first, the logical gate 13 and the shortest mask line 4 will be described. The shortest mask line 4 is pulled up by a resistor 16 (FIG. 5) to be put into a valid state "1" prior to a searching operation. The logical gate 13 comprises MOS transistors (T9 and T10) 213 and 214 connected in cascade between the shortest mask line 4 and a low potential. The MOS transistor (T9) 213 is put into a conductive state and an opened state when a match line 7 is in a valid state "1" and an invalid state "0", respectively. The MOS transistor (T10) 214 is put into a conductive state and an opened state when an inverted logical gate (G3) 209 in the mask cell 10 produces an output of a high level and a low level, respectively, i.e., when the mask information stored in the mask cell 10 is in an invalid state "0" and a valid state "1", respectively. Thus, the logical gate 13 supplies an invalid state "0" to the shortest mask line 4 when the match line 7 is in a valid state "1" and the mask information stored in the mask cell 10 is in an invalid state "0". Otherwise, the logical gate 13 puts the shortest mask line 4 into an opened state.

Next, description will proceed to the operation of the mask comparator 18 and the mask match line 19. The mask match line 19 is pulled up to a high potential by a resistor (not shown) or precharged to a high potential prior to the searching operation.

The mask comparator 18 comprises MOS transistors (T11, T12, and T13) 215, 216. and 217. The MOS transistors (T11 and T12) 215 and 216 are connected in cascade between the bit lines 6a and 6b. The MOS transistor (T11) 215 is put into a conductive state when the inverted logical gate (G3) 209 in the mask cell 10 produces an output of a high level. The MOS transistor (T12) 216 is put into a conductive state when an inverted logical gate (G4) 210 in the mask cell 10 produces an output of a high level. The MOS transistor (T13) 217 is connected between a low potential and the mask match line 19. The MOS transistor (T13) 217 is put into a conductive state when a junction or node of the MOS transistor (T11) 215 and the MOS transistor (T12) 216 has a potential of a high level. When both the bit line 6a and the inverted logical gate (G3) 209 produce outputs of a high level or when both the bit line 6b and the inverted logical gate (G4) 210 produce outputs of a high level, the junction of the MOS transistor (T11) 215 and the MOS transistor (T12) 216 has a potential of a high level so that the MOS transistor (T13) 217 is put into a conductive state. Otherwise, the MOS transistor (T13) 217 is put into an opened state.

Therefore, when the mask information stored in the mask cell 10 is different from the search data 105 on the bit lines 6a and 6b, the MOS transistor (T5) 207 is put into a conductive state to supply an invalid state "0" to the mask match line 19. Upon coincidence, the mask match line 19 is put into an opened state.

Thus, a wired AND connection is achieved such that, when at least one of the associative memory cells 12 connected through the MOS transistor (T13) 217 to the mask match line 19 produces a low level, the mask match line 19 is given a low level and otherwise a high level. With the above-mentioned arrangement, it is possible to realize the function of the associative memory cells 12 in FIG. 5.

In the associative memory cell 12 illustrated in FIG. 6, it is assumed that each of the inverted logical gates 201, 202, 209,. and 210 comprises two MOS transistors. In this event, the associative memory cell 12 can be formed by twenty-one MOS transistors in total. For example, the 64-bit 1024-word first associative memory 1 requires approximate 1,300,000 MOS transistors for the associative memory cells 12. Since other portions except the associative memory cells can be generally formed by MOS transistors not greater in number than several tens of thousands, the associative memory 1 can be formed by approximate 1,300,000 MOS transistors.

On the other hand, the conventional associative memory cell in FIG. 3 can be formed by sixteen MOS transistors in total if calculated in a similar manner. Therefore, the associative memory 1 in FIG. 5 can be realized by a circuit scale corresponding to about 1.3 times that of the conventional associative memory in FIG. 3 as given by 21/16 .=. 1.3.

Turning back to FIG. 5, the operation of the first associative memory 1 as a whole will be described. With reference to the state of a control signal 23, the two-input/one-output n-bit selector 17 selects, as output data to be supplied to the bit lines 6-1 through 6-n, either the search data 105-1 through 105-n or latch output lines 22-1 through 22-n. Each associative memory word 8 produces a corresponding one of the mask match lines 19. For example, the first associative memory word 8-1 produces the mask match line 19-1. All of the associative memory cells 12, n in number, in each associative memory word 8 are connected to the corresponding one of the mask match lines 19 by a wired logic connection.

The n-bit latch 21 stores the states of the shortest mask lines 4-1 through 4-n as stored states when a latch control signal 24 is in a valid state. The n-bit latch 21 supplies the stored states to the latch output lines 22-1 through 22-n.

The latches 20-1 through 20-m store the states of the match lines 7-1 through 7-m in the associative memory words 8-1 through 8-m as stored states, respectively, when latch control signals are in a valid state. In order to produce the stored states, each latch 20 is connected to the mask match line 19 in the corresponding associative memory word by the wired logic connection Upon completion of the searching operation, only one of the mask match lines 19-1 through 19-m is put into a valid state while the others are put into an invalid state. The mask match lines 19 put into a valid state corresponds to one of the storage data coincident with the search data 105 which has a least number of bits excluded from the search object by the mask information.

In this embodiment, a valid state and an invalid state are represented by "1" and "0", respectively, for all of the mask information, the shortest mask lines 4-1 through 4-8, the match lines 7-1 through 7-5, and the mask match lines 11 through 9-m.

Each of the mask match lines 19-1 through 19-m are pulled up by a resistor (not shown) prior to start of the searching operation or precharged to a high level to be put into a valid state "1". The latches 20-1 through 20-m supply to the corresponding mask match lines 19-1 through 19-m with "0" and "1" when the stored data have an invalid state "0", respectively, and put the mask match lines 19-1 through 19-m into an opened state when the stored data have a valid state "1".

The mask comparators 18-1-1 through 18--m-n in the associative memory cells 12-1-1 through 12-m-n correspond to the mask cells 10-1-1 through 10-m-n in the same associative memory cells 12-1-1 through 12-m-n, respectively, the bit lines 6-1 through 6-n, and the mask match lines 19-1 through 19-m.

Each of the mask comparator 18 compares the state of the mask information stored in the corresponding mask cell 10 and the shortest mask information on the corresponding bit line 6. Upon coincidence, the mask comparator 18 puts the corresponding mask match line 19 into an opened state.

Upon incoincidence, the mask comparator 18 supplies an invalid state "0" to the corresponding mask match line 19. Thus, the wired AND logic connection is achieved such that, when all of the associative memory cells 12, n in number, and the latch 20 in the associative memory word 8 render the mask match line 19 in an opened state, the mask match line 19 is put into a valid state "1" and otherwise into an invalid state "0".

In other words, only when the mask information stored in the associative memory work 8 is completely coincident with the bit lines 6-1 through 6-n and the state of the match line 7 stored in the latch 20 is a valid state "1", the mask match line 19 is put into a valid state "1" and otherwise into an invalid state "0". Instead, use may be made of an ordinary logical gate so that the above-mentioned operation is performed.

Figure 7:
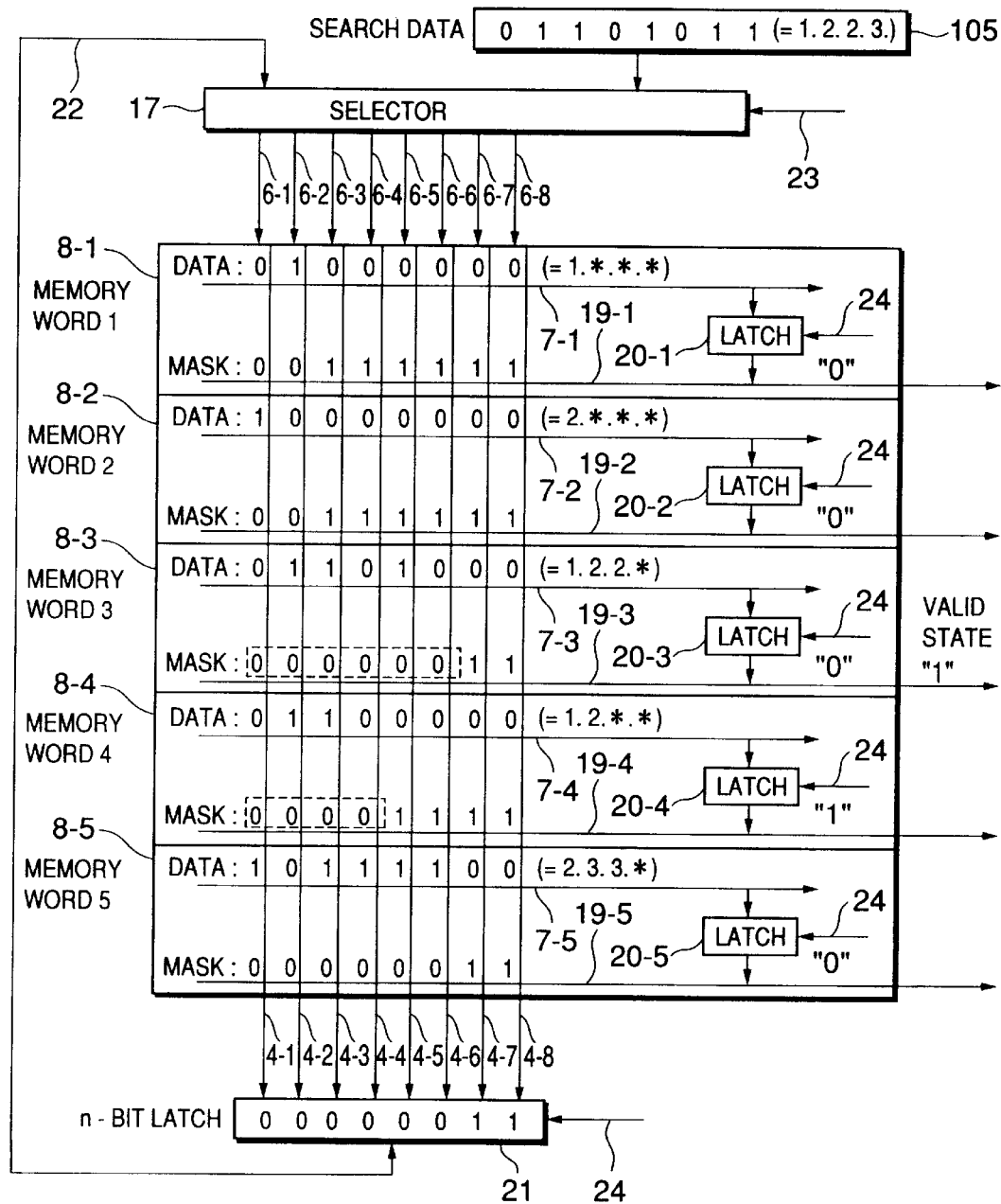
FIG. 7 is a view for describing an operation of the associative memory in FIG. 5.

Next referring to FIG. 7, description will be made about the operation when the above-mentioned first associative memory 1 is used in calculating the transfer network address in the router 300-3 in FIG. 1.

In the similar manner, a valid state and an invalid state are represented by "1" and "0", respectively, for all of the mask information, the shortest mask lines 4-1 through 4-8, the match lines 7-1 through 7-5, and the mask match lines 19-1 through 19-5.

It is assumed here that the associative memory 1 comprises five words of eight bits. Therefore, the storage data and the mask information stored in each of the associative memory words 8-1 through 8-5 are quite similar to those of the associative memory in FIG. 2. The associative memory 1 memorizes the connection information except the network address (3, *, *, *) of the router 300-3 in FIG. 1. Specifically, the associative memory word 8-1 stores in binary numbers the storage date (01, 00, 00, 00) and the mask information (00, 11, 11, 11) to implement (1, *, *, *). Likewise, the associative memory words 8-2, 8-3, 8-4, and 8-5 store (2, *, *, *), (1, 2, 2, *), (1, 2, *, *), and (2, 3, 3, *), respectively.

Description will proceed to the searching operation by supplying as the search data 105 the network address (1, 2, 2, 3), in quadridecimal numbers, of the user's terminal (PC) 301-1 in FIG. 1.

At first, the two-input/one-output 8-bit selector 17 is responsive to the selection signal 23 and selects the search data 105 to deliver the search data 105 to the bit lines 6-1 through 6-8. Therefore, the quadridecimal notations (1, 2, 2, *) and (1, 2, *, *) respectively stored in the associative memory words 8-3 and 8-4 in the associative memory 1 are coincident with the search data 105 on the bit lines 6. Accordingly, the match lines 7-3 and 7-4 are put into a valid state "1" while the remaining match lines 7-1, 7-2, and 7-5 are put into an invalid state "0".

Herein, the shortest mask line 4-1 produces the logical product "0" of the mask bit information "0" and "0" in the memory words 7-3 and 7-4 at bit positions corresponding to the shortest mask line 4-1. The shortest mask line 4-2 produces the logical product "0" of the mask information "0" and "0" in the memory words 7-3 and 7-4 at bit positions corresponding to the shortest mask line 4-2. Likewise, the shortest mask lines 4-3, 4-4, 4-5, 4-6, 4-7, and 4-8 produce the logical product "0" of "0" and "0", the logical product "0" of "0" and "0", the logical product "0" of "0" and "1", the logical product "0" of "0" and "1", the logical product "1" of "1" and "1", and the logical product "1" of "1" and "1", respectively. As a result, the binary notation "00000011" is delivered to the shortest mask lines 4-1 through 4-8.

In this state, the latch control signal 24 is put into a valid state. The latches 20-1 through 20-5 store the states of the corresponding match lines 7-1 through 7-5, respectively, while the n-bit latch 21 stores the states of the shortest mask lines 4-1 through 4-8. Accordingly, the latches 20-1, 20-2, 20-3, 20-4, and 20-5 store "0", "0", "1", "1", and "0", respectively, while the n-bit latch 21 stores the binary notation "00000011". The n-bit latch 21 delivers the stored state "00000011" to the latch output line 22.

In response to the selection signal 23, the two-input/one-output 8-bit selector 17 selects the latch output line 22 and supplies the information "00000011" on the latch output line 22 to the corresponding bit lines 6-1 through 6-8. Thereafter, the associative memory starts a second searching operation. In the second searching operation, use is made of the states of the mask match lines 19-1 through 19-8 while the states of the match lines 7-1 through 7-8 are ignored.

Prior to start of the second searching operation, the mask match lines 19-1 through 19-8 are precharged to a high level or pulled up to a high level by a resistor (not shown) to be put into a valid state "1".

The mask information stored in each of the associative memory words 8-3 and 8-5 is completely coincident with the states "00000011" on the bit lines 6-1 through 6-8 so that the corresponding mask match lines 19-3 and 19-5 are put into an opened state. Since the mask information stored in any other associative memory words 8-1, 8-2, and 8-4 is not coincident, the corresponding mask match lines 19-1, 19-2, and 19-4 are supplied with an invalid state "0".

The latch 20-1 delivers the stored state "0" to the corresponding mask match line 19-1. The latch 20-2 delivers the stored state "0" to the corresponding mask match line 19-2. The latch 20-3 puts the corresponding mask match line 19-3 into an opened state because the stored state is "1". The latch 20-4 puts the corresponding mask match line 19-4 into an opened state because the stored state is "1". The latch 20-5 delivers the stored state "0" to the corresponding mask match line 19-5.

Therefore, the mask match line 19-1 is put into an invalid state "0" because the match line 7-1 of the associative memory word 8-1 produces "0" and the latch 20-1 produces "0". The mask match lines 19-2 is put into an invalid state "0" because the match line 7-2 of the associative memory word 8-2 produces "0" and the latch 20-2 produces "0". The mask match line 19-3 maintains a valid state "1" because the match line 7-3 of the associative memory word 8-3 is in an opened state and the latch 20-3 is in an opened state. The mask match line 19-4 is put into an invalid state "0" because the match line 7-4 of the associative memory word 8-4 produces "0" although the latch 20-4 is in an opened state. The mask match line 19-5 is put into an invalid state because the match line 7-5 of the associative memory word 8-5 produces "0" although the latch 20-5 is in an opened state.

Thus, only one of the mask match lines 19-1 through 19-5 corresponding to a particular one of the associative memory words 8-1 through 8-5 is in a valid state "1" upon completion of the second searching operation. Specifically, the storage data preliminarily stored in the particular associative memory word (8-3 in the illustrated example) is selected in the first searching operation as coincident with the search data 105 taking the mask information into account while the mask information preliminarily stored is selected in the second searching operation as coincident with the states of the shortest mask lines 4-1 through 4-8 obtained by the first searching operation.

Figure 8:
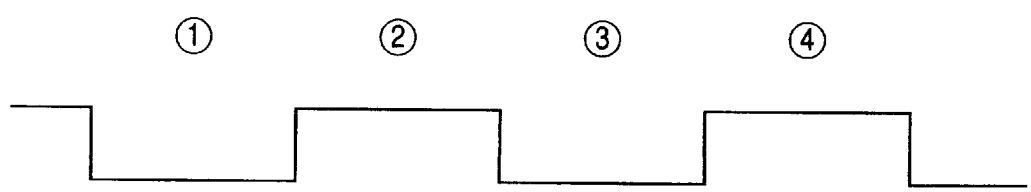
FIG. 8 is a timing chart for describing the operation of the associative memory in FIG. 5.

Referring to FIG. 8, the first and the second searching operations will be described by the use of a timing chart.

At (1), all of the bit lines, the match lines, and the mask match lines are precharged to a high level ("1").

At a leading edge of (2), each bit line is supplied with the corresponding bit information of the search data. When the bit information on the bit line is coincident with the bit information of the corresponding storage data in each memory word or when the mask information of the corresponding bit is "1", the match line of the memory word is put into a valid state "1" while the match lines of the other memory words are put into an invalid state "0".

Each shortest mask line is supplied with the logical product of the corresponding mask bit information of the memory words in a valid state.

Herein, the latch control signal is activated so that the value on the match line of each memory word is stored in the latch 20. The bit information of each shortest mask line is stored in the n-bit latch 21 and delivered to the corresponding latch output line 22.

(3) Then, all of the bit lines, the match lines, and the mask match lines are precharged to a high level. For the mask match lines, only the mask match lines of the memory words with their latches 20 storing "1" may be precharged to a high level.

At the leading edge of (4), the bit information on each latch output line is delivered to the corresponding bit line 6 in response to the selection signal 23. Only when the bit information is coincident with the mask information in the memory word and the latch 20 of the memory word stores "1", the mask match line of the memory word produces a valid state "1".

As described above, by the use of the first associative memory according to the first embodiment of this invention, it is possible to select an optimum memory word in two clocks with reference to the values of the mask match lines.

The first searching means is for producing, when one or more storage data are coincident with the search data, the result of the logical multiplication with respect to the mask valid states for all of the mask information corresponding to those coincident storage data. The second searching means is for producing the signal identifying, among one or more storage data coincident with the search data, particular storage data having the mask information coincident with the calculation result produced by the first searching means. In the first embodiment of this invention, circuit components of the first searching means also serve as circuit components of the second searching means. With this structure, it is possible in a circuit scale corresponding to 1.3 times that of the conventional associative memory in FIG. 3 to identify, among the coincident storage data, the particular storage data with a least number of bits excluded from the search object by the mask information.

Figure 9:
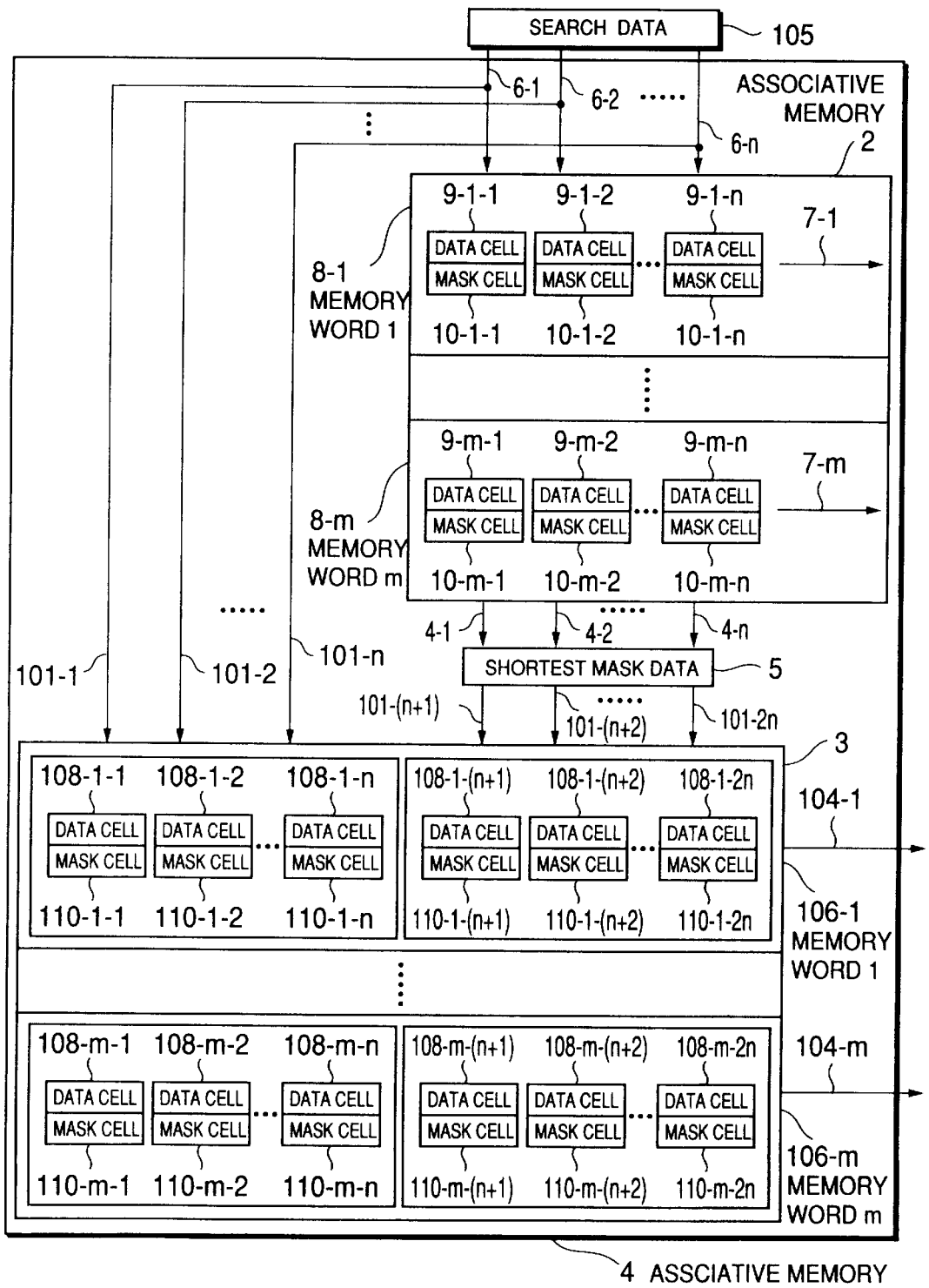
FIG. 9 is a block diagram of an associative memory according to a second embodiment of this invention.

Next referring to FIG. 9, description will be made about an associative memory 4 according to a second embodiment of this invention.

The associative memory 4 comprises an n-bit/m-word associative memory 2 with a shortest mask producing function and a 2n-bit/m-word second associative memory 3. The n-bit/m-word associative memory 2 with a shortest mask producing function is supplied with search data 105 through second bit lines 6-1 through 6-n, n in number, and calculates shortest mask data 5 to be delivered to shortest mask lines 4-1 through 4-n, n in number.

The 2n-bit/m-word second associative memory 3 compares the n-bit search data 105 supplied thereto and the storage data stored therein taking its mask information into account. Then, the 2n-bit/m-word second associative memory 3 supplies a valid state to only one of first through m-th match lines 104-1 through 104-m which corresponds to particular storage data with a least number of bits excluded from the search object by the mask information. The second associative memory 3 is similar in structure to the conventional associative memory 100 except that a single word comprises 2n bits.

Among first through 2n-th bit lines 101-1 through 101-2n connected to the second associative memory 3, the first through the n-bit lines 101-1 through 101-n are supplied with the n-bit search data 105. On the other hand, the (n+1)-th through the 2n-th bit lines 101-(n+1) through 101-2n are supplied with the n-bit shortest mask data 5. The first through the 2n-th bit lines 101-1 through 101-2n are supplied to each of first through m-th associative memory words 106-1 through 106-m. Each of the first through the m-th associative memory words 106-1 through 106-m has data cells 108, 2n in number, and mask cells 110, 2n in number. The search result for the values on the first through the 2n-th bit lines 101-1 through 101-2n as the search data is supplied to the first through the m-th match lines 104-1 through 104-m.

The associative memory 2 with a shortest mask producing function is similar in structure to the conventional associative memory 100 except that the shortest mask lines 4-1 through 4-n are produced. The second bit lines 6-1 through 6-n, n in number, given the n-bit search data 105 are supplied to each of the first through the m-th second associative memory words 8-1 through 8-m. Each of the second associative memory words 8-1 through 8-m has second data cells 9 and second mask cells 10, both n in number. The search result for the values on the second bit lines 6-1 through 6-n, n in number, as the search data is supplied to second match lines 7-1 through 7-m, m in number. The first through n-th shortest mask lines 4-1 through 4-n correspond to the second mask cells 10-1-1 through 10-1-n, . . . , 10-m-1 through 10-m-n, respectively, on one-to-m correspondence. For example, the shortest mask line 4-1 corresponds to the second mask cells 10-1-1, 10-2-1, . . . , 10-m-1, m in number.

Upon the searching operation, each of the first through the n-th shortest mask lines 4-1 through 4-n is put into a valid state when all of the mask information stored in those of the corresponding m second mask cells 10 which correspond to the valid-state ones of the second match lines 7-1 through 7-m are in a valid state. If at least one mask information is in an invalid state, the corresponding shortest mask line 4 is put into an invalid state. In other words, the logical product is produced.

For example, it is assumed that the second match lines 7-1 and 7-2 alone produce a valid state. In this event, the shortest mask line 4-1 produces the logical product of the memory states of the second mask cells 10-1-1 and 10-2-1. The shortest mask line 4-2 produces the logical product of the memory states of the second mask cells 10-1-2 and 10-2-2. Likewise, the shortest mask line 4-n produces the logical product of the memory states of the second mask cells 10-1-n and 10-2-n.

In each of the n-bit second associative memory words 8-1 through 8-m, m in number, of the associative memory 2 with a shortest mask producing function, the n second data cells 9 and the n second mask cells 10 preliminarily store n-bit memory information and its mask information prior to the searching operation, respectively. The m associative memory words 106 of the second associative memory 3 correspond to the m second associative memory words 8 of the associative memory 2 with a shortest mask producing function, respectively.

Among the 2n data cells 108 and the 2n mask cells 110 of the m 2n-bit associative memory words 106 in the second associative memory 3, the n data cells 108 and the n mask cells 110 corresponding to the bit lines 101-1 through 101-n preliminarily store the same information as the n-bit storage information and the n-bit mask information stored in the second data cells 9 and the second mask cells 10 in the corresponding second associative memory words 8 of the associative memory 2 with a shortest mask producing function, respectively.

The n data cells 108 in the associative memory word 106 corresponding to the bit lines 101-(n+1) through 101-2n preliminarily store the storage information same as the mask information stored in the mask cells 110 in the same associative memory word 106 corresponding to the bit lines 101-1 through 101-n. The n mask cells 110 in the associative memory word 106 corresponding to the bit lines 101-(n+1) through 101-2n preliminarily store an invalid state.

Figure 10:
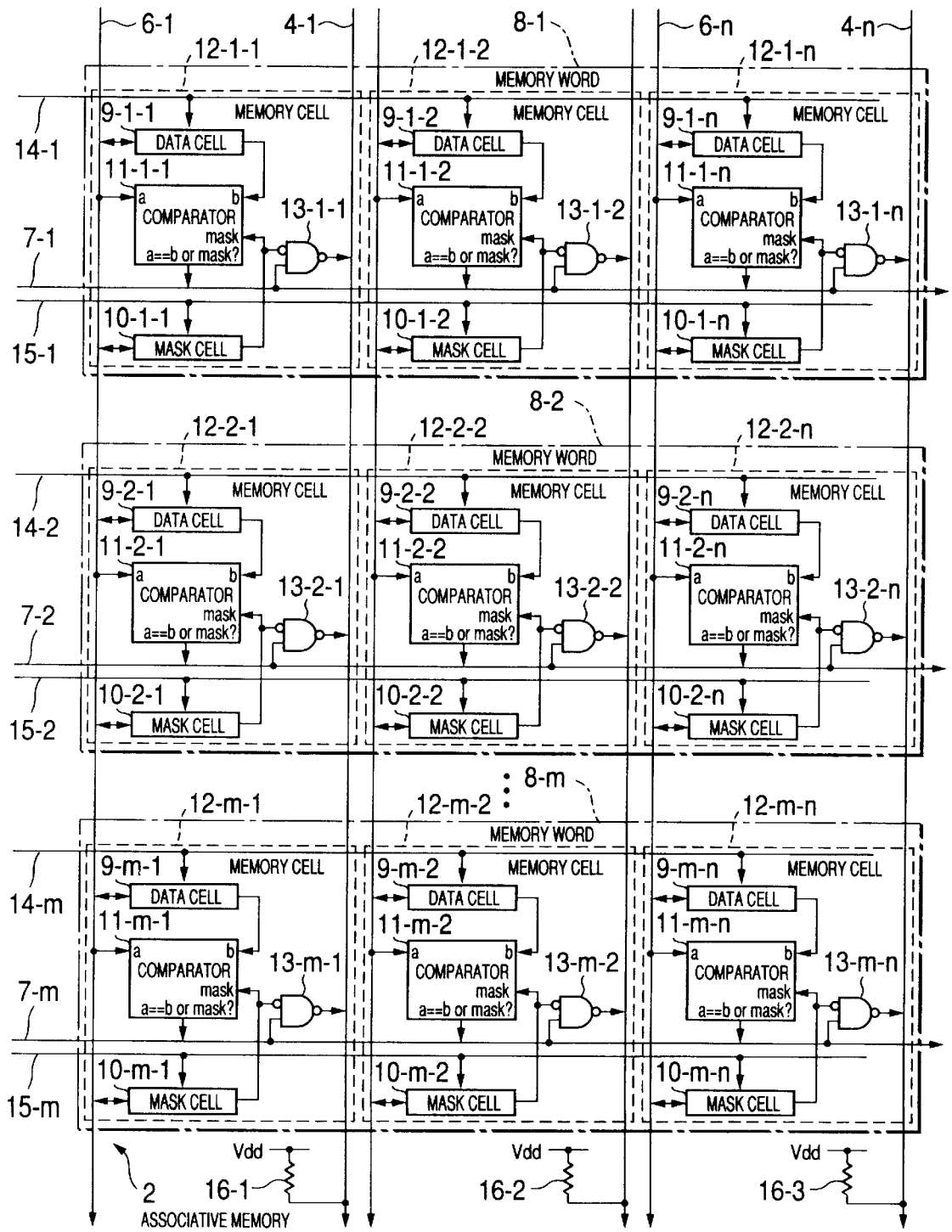
FIG. 10 is a block diagram of an associative memory with a shortest mask producing function illustrated in FIG. 9.

Referring to FIG. 10, the n-bit/m-word associative memory 2 with a shortest mask producing function will be described. In the following description, a valid state and an invalid state are represented by "1" and "0", respectively, for all of the mask information, the shortest mask lines 4-1 through 4-n, and the second match lines 7-1 through 7-m.

The associative memory 2 with a shortest mask producing function comprises m second associative memory words 8-1 through 8-m, the n second bit lines 6-1 through 6-n, m second data word lines 14-1 through 14-m, m second mask word lines 15-1 through 15-m, the m second match lines 7-1 through 7-m, the n shortest mask lines 4-1 through 4-n, and n resistors 16-1 through 16-n. Each of the second associative memory words 8-1 through 8-m comprises n second associative memory cells 12. Each of the second associative memory cells 12 comprises a second associative data cell 9, a second comparator 11, a second mask cell 10, and a logical gate 13.

In comparison between the associative memory 2 with a shortest mask producing function and the conventional associative memory 100 in FIG. 3, the second bit lines 6-1 through 6-n correspond to the bit lines 101-1 through 101-n, the second data word lines 14-1 through 14-m to the data word lines 102-1 through 102-m, the second mask word lines 15-1 throgh 15-m to the mask word lines 103-1 through 103-m, the second match lines 7-1 through 7-m to the match lines 104-1 through 104-m, the second associative memory words 8-1 through 8-m to the associative memory words 106-1 through 106-m, and the second associative memory cells 12 to the associative memory cells 107. Furthermore, the second data cells 9, the second comparator 11, and the second mask cells 10 correspond to the data cells 108, the comparator 109, the mask cells 110, respectively. Each of these corresponding components performs the similar operation.

Each of the n shortest mask lines 4-1 through 4-n is connected to the m second associative memory words 8-1 through 8-m and pulled up to a high level by a single corresponding resistor 16. For example, the shortest mask line 4-1 corresponds to the resistor 16-1. The n second associative memory cells 12 of each of the second associative memory words 8-1 through 8-m are connected to corresponding ones of the n shortest mask lines 4-1 through 4-n, respectively. For example, the second associative memory cell 12-1-1 of the second associative memory word 8-1 is connected to the shortest mask line 4-1.

The logical gate 13 in each of the second associative memory cells 12 is supplied with an output signal of the second mask cell 10 and the corresponding second match line 7-2 and is connected to the corresponding shortest mask line 4 by the wired logic connection. The logical gate 13 supplies an invalid state "0" to the corresponding shortest mask line 4 when the second mask cell 10 stores the mask information "0" in an invalid state and the corresponding second match line 7 is in a valid state "1". Otherwise, the shortest mask line 4 is put into an opened state. Therefore, the wired logic connection is formed so that, when at least one of all of the corresponding logical gates 13 connected to the shortest mask line 4 produces an invalid state "0", the shortest mask line 4 is put into an invalid state "0" and otherwise into a valid state "1". In other words, the wired AND logic is formed such that, only when all of the mask information stored in the second mask cells 10 corresponding to the valid-state second match lines 7 is in a valid state "1", the corresponding shortest mask line 4 is put into a valid state. As will readily be understood, use may be made of an ordinary logical gate so that the similar logical operation is performed. With the above-mentioned arrangement, the associative memory 2 with a shortest mask producing function in FIG. 9 can be achieved.

Figure 11:
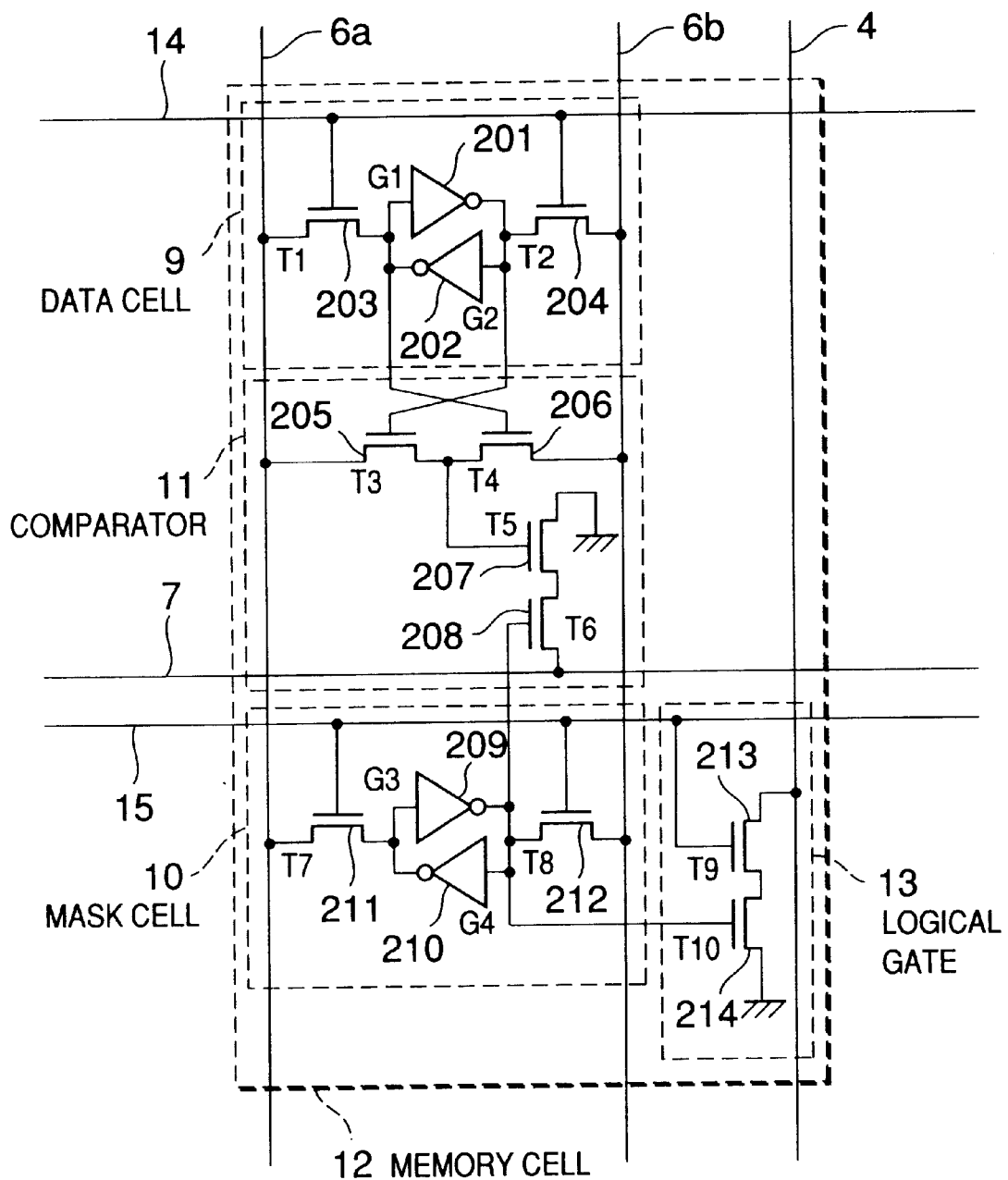
FIG. 11 is a circuit diagram of an associative memory cell of the associative memory with a shortest mask producing function illustrated in FIG. 10.

Referring to FIG. 11, the second associative memory cell 12 of this invention has a circuit structure illustrated in the figure. A valid state and an invalid state are represented by "1" and "0", respectively, for all of the mask information, the shortest mask lines 4, and the second match lines 7. As seen from the figure, the second associative memory cell 12 in FIG. 11 is similar to the associative memory cell in FIG. 6 except that the mask comparator and the mask match line combined thereto are removed. The operation of each of the data word line, the match line, the mask word line, the data cell, the comparator, the mask cell, and the logical gate is similar to that illustrated in FIG. 6 and the description thereof will not be repeated.

Figure 12:
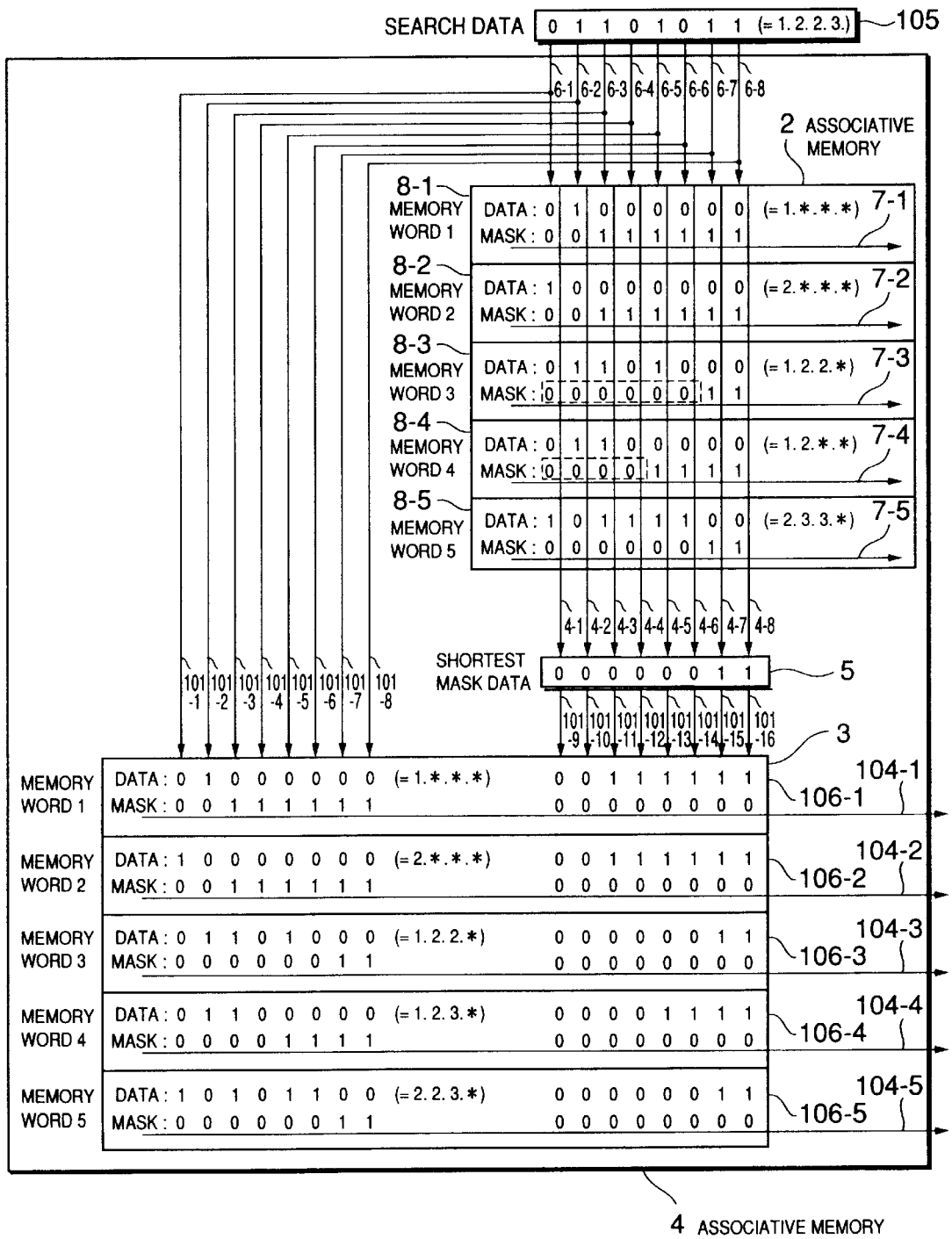
FIG. 12 is a view for describing an operation of the associative memory illustrated in FIG. 9.

Next referring to FIG. 12, the description will be made about the operation when the associative memory 4 of this invention is applied to the network router 300-3 in FIG. 1.

A valid state and an invalid state are represented by "1" and "0", respectively, for all of the mask information stored in the associative memory 2 with a shortest mask producing function and in the second associative memory 3, the shortest mask lines 4-1 through 4-8, the second match lines 7-1 through 7-5, and the match lines 104-1 through 104-5.

Figure 2:
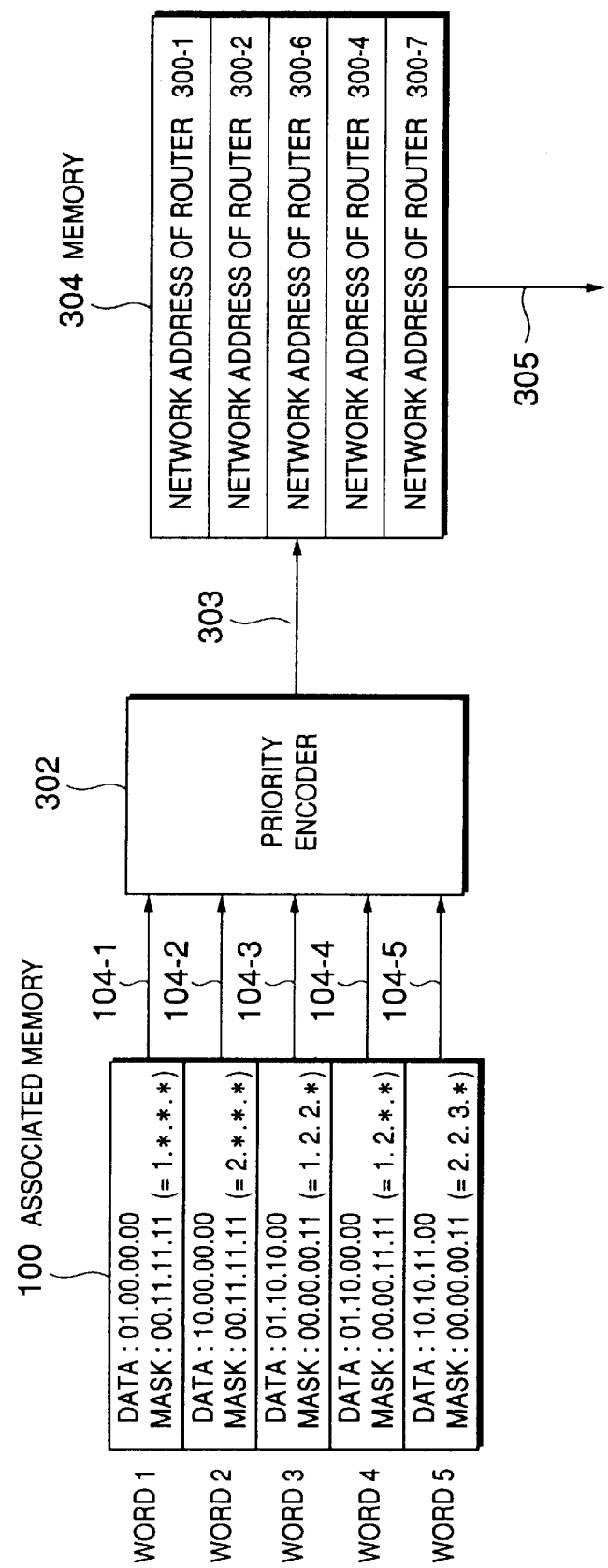
FIG. 2 shows a router using the conventional associative memory.

Like the conventional associative memory 100 in FIG. 2, the 8-bit/5-word associative memory 2 with a shortest mask producing function memorizes the connection information except the network address (3, *, *, *) of the router 300-3 itself. The second associative memory word 8-1 stores in binary numbers the storage data (01, 00, 00, 00) and the mask information (00, 11, 11, 11) to represent (1, *, *, *). Likewise, the second associative memory words 8-2, 8-3, 8-4, and 8-5 stores (2, *, *, *), (1, 2, 2, *), (1, 2, *, *), and (2, 3, 3, *), respectively.

In the 16-bit storage data and the 16-bit mask information stored in the associative memory words 106-1 through 106-5 of the second associative memory 3, 8 bit regions (hereinafter referred to as lower 8 bits) corresponding to the bit lines 101-1 through 101-8 store the same storage data and the same mask information as the 8-bit storage data and the 8-bit mask information stored in the corresponding second associative memory words 8 of the associative memory 2 with a shortest mask producing function.

Specifically, the lower 8 bits of the associative memory word 106-1 stores in binary numbers the storage data (01, 00, 00, 00) and the mask information (00, 11, 11, 11) to represent the quadridecimal numbers (1, *, *, *). Likewise, the lower 8 bits of the associative memory words 106-2, 106-3, 106-4, and 106-5 store the binary numbers corresponding to the quadridecimal numbers (2, *, *, *), (1, 2, 2, *), (1, 2, *, *), and (2, 3, 3, *), respectively.

In the 16-bit storage data and the 16-bit mask information stored in the associative memory words 106-1 through 106-5 of the second associative memory 3, 8 bit regions (hereinafter referred to as upper 8 bits) corresponding to the bit lines 101-9 through 101-16 store, as the storage information, the mask information stored in the lower 8 bits of the same associative memory words 106-1 through 106-5 and, as the mask information, an invalid state for all of the 8 bits. Specifically, the upper 8 bits of the associative memory word 106-1 store the storage data (00, 11, 11, 11) and the mask information (00, 00, 00, 00). Likewise, the upper 8 bits of the associative memory word 106-2 store the storage data (00, 11, 11, 11) and the mask information (00, 00, 00, 00). The upper 8 bits of the associative memory word 106-3 store the storage data (00, 00, 00, 11) and the mask information (00, 00, 00, 00). The upper 8 bits of the associative memory word 106-4 store the storage data (00, 00, 11, 11) and the mask information (00, 00, 00, 00). The upper 8 bits of the associative memory word 106-5 store the storage data (00, 00, 00, 11) and the mask information (00, 00, 00, 00).

Thus, the 16-bit associative memory words 106-1, 106-2, 106-3, 106-4, and 106-5 store the binary numbers (01, , , , 00, 11, 11, 11), (10, , , , 00, 11, 11, 11), (01, 10, 10, , 00, 00, 00, 11), (01, 10, , , 00, 00, 11, 11), and (10, 11, 11, , 00, 00, 00, 11), respectively.

Now, description will be made about the searching operation for the network address (1, 2, 2, 3) of the user's terminal (PC) 301-1 in quadridecimal numbers as the search data.

Like in the conventional associative memory 100 in FIG. 2, the quadridecimal notations (1, 2, 2, *) and (1, 2, *, *) stored in the second associative memory words 8-3 and 8-4 of the associative memory 2 with a shortest mask producing function are coincident with the search data. Therefore, the second match lines 7-3 and 7-4 are put into a valid state "1" while the remaining second match lines 7-1, 7-2, and 7-5 are put into an invalid state "0".

Therefore, the shortest mask line 4-1 produces the logical product "0" of the mask information "0" and "0" in the memory words 8-3 and 8-4 at bit positions corresponding to the shortest mask line 4-1. The shortest mask line 4-2 produces the logical product "0" of the mask information "0" and "0" in the memory words 8-3 and 8-4 at bit positions corresponding to the shortest mask line 4-2. Likewise, the shortest mask lines 4-3, 4-4, 4-5, 4-6, 4-7, and 4-8 produce the logical product "0" of "0" and "0", the logical product "0" of "0" and "0", the logical product "0" of "0" and "1", the logical product "0" of "0" and "1", the logical product "1" of "1" and "1", and the logical product "1" of "1" and "1", respectively. As a result, the binary notation "00000011" is produced as the shortest mask data 5.

The bit lines 101-1 through 101-8 are supplied with the search data 105 in the binary notation "01101011". The bit lines 101-9 through 101-16 are supplied with the shortest mask data 5 in the binary notation "00000011". Therefore, the bit lines 101-1 through 101-16 are supplied with "0110101100000011". When the above-mentioned data are searched by the second associative memory 3 with respect to a whole of the 16 bits, (01, 10, 10, , 00, 00, 00, 11) of the associative memory word 3 alone is coincident so that the match line 104-3 alone produces a valid state. In the conventional associative memory described above, both of the match lines 104-3 and 104-4** corresponding to the quadridecimal notations (1, 2, 2, *) and (1, 2, *, *) are put into a valid state. On the other hand, in the associative memory 1 of this invention, only the match line 104-3 corresponding to (1, 2, 2, *) with a least amount of information excluded from the search object by the mask information is put into a valid state.

As described above, by the use of the associative memory of the second embodiment, it is possible to select in a single clock the particular word having the shortest mask information.

Figure 13:
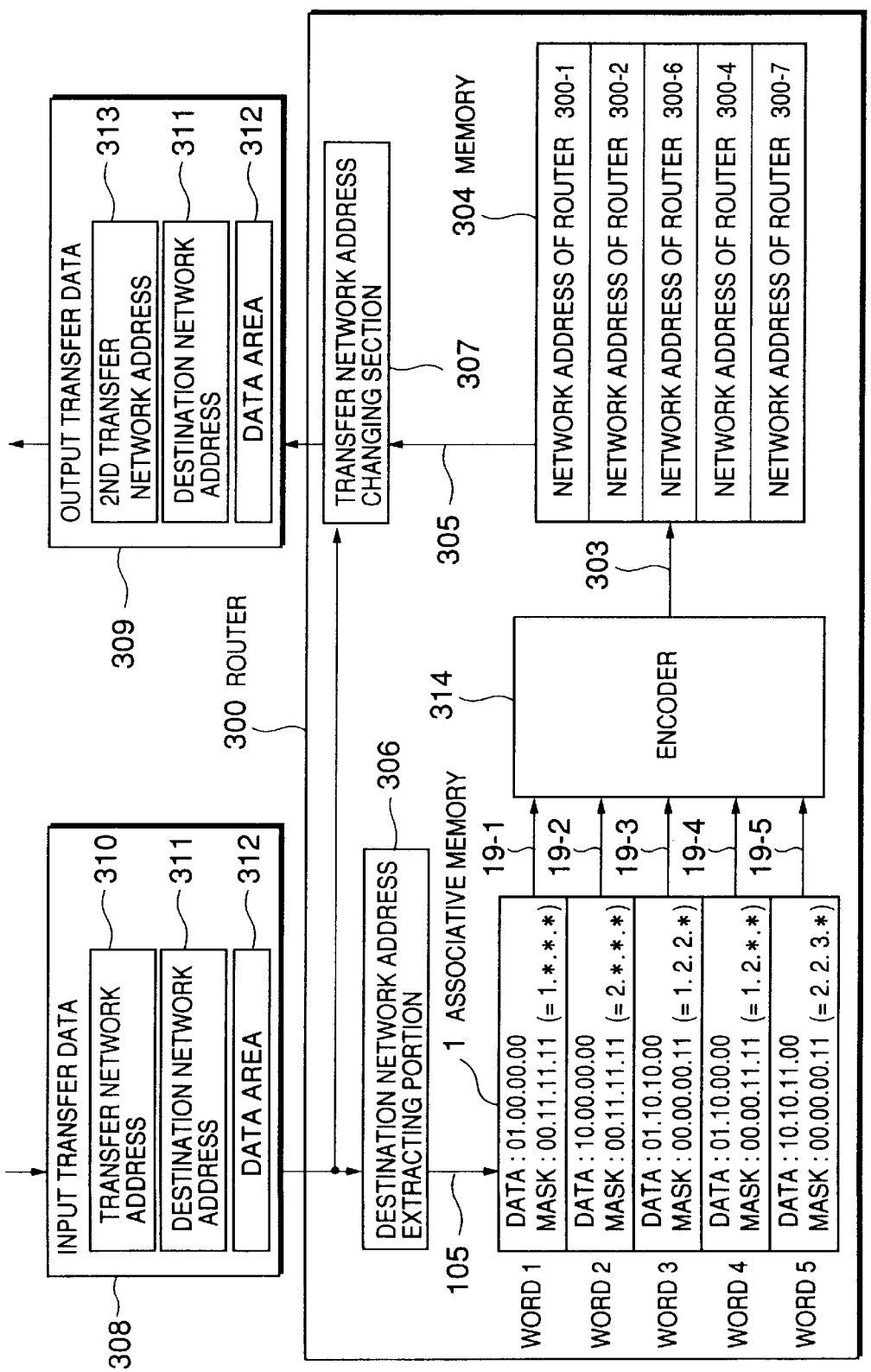
FIG. 13 is a block diagram of a router using the associative memory of this invention.

Next referring to FIG. 13, the associative memory 1 of the first embodiment or the associative memory 4 of the second embodiment is used in the router to calculate the transfer network address. The router 300 is supplied with input transfer data 308 and produces output transfer data 309. The input transfer data 308 comprise a destination network address 311, a transfer network address 310, and a data area 312. The output transfer data 309 comprise the destination network address 311, a second transfer network address 313, and the data area 312.

As will readily be understood, the transfer network address 310 in the input transfer data 308 is the network address of the router 300 itself. The router 300 comprises a destination network address extracting section 306, the associative memory 1, an encoder 314, a memory 304, and a transfer network address changing section 307.

Herein, description will be made about the case where the associative memory is applied to the router 300-3 in FIG. 1. It is assumed that the input data are transferred from an apparatus having a network address (3, *, *, *) to another apparatus having a network address (1, *, *, *) or (2, *, *, *). In FIG. 13, a valid state and an invalid state are represented by "1" and "0", respectively, for both of the mask information and the mask match lines 19-1 through 19-5.

The destination network address extracting section 306 extracts the destination network address 311 contained in the input transfer data 308 and supplies the destination network address 311 to the associative memory 1 as the search data 105.

The associative memory 1 memorizes the connection information except the network address (3, *, *, *) of the router 300-3 itself. The word 1 stores in binary numbers the storage data (01, 00, 00, 00) and the mask information (00, 11, 11, 11) to represent (1, *, *, *).

Likewise, the words 2, 3, 4, and 5 store the binary numbers representing (2, *, *, *), (1, 2, 2, *), (1, 2, *, *), and (2, 3, 3, *), respectively. The mask match lines 19-1 through 19-5 corresponding to the words 1 through 5 are supplied to the encoder 314. The encoder 314 encodes the mask match lines 19-1 through 19-5 and delivers the encoded result to the memory 304 as the memory address signal 303.

in the memory 304, the network address of the router corresponding to the network address formed by the storage data and the mask information of each word in the associative memory 1 is stored in each corresponding word. For example, the word 1 of the associative memory 1 stores the network address (1, *, *, *). The network address of the router 300-1 corresponding thereto is stored in the word 1 of the memory 304. Likewise, the words 2, 3, 4, and 5 of the memory 304 store the network addresses of the routers 300-2, 300-6, 300-4, and 300-7, respectively. Thus, the memory 304 produces as a memory data signal 305 one of the stored data designated by the memory address signal 303 as a read address.

The transfer network address changing section 307 changes the transfer network address 310 in the input transfer data 308 into the value of the memory data signal 305 as the second transfer network address 313 in the output transfer data 309. Then, the output transfer data 309 is transferred to a network apparatus corresponding to the second transfer network address 310.

It is assumed that the destination network address 311 in the input transfer data 308 is (1, 2, 2, 3). In this event, unlike the conventional associative memory 100 in FIG. 2, the mask match line 19-3 of the word 3 alone is put into a valid state as a result of the searching operation by the associative memory 1. Then, the encoder 302 produces "3" as the memory address 303. The memory 304 produces the memory data signal 305 representative of the network address of the router 300-6. The transfer network address changing section 307 changes the transfer network address 310 in the input transfer data 308 into the network address of the router 300-6 as the second transfer network address 313 in the output transfer data 309. Thus, the output transfer data 309 are delivered to the router 300-6.

As mentioned above, the associative memory of this invention selects a single optimum word to be directly outputted. As compared with the conventional router which calculates the transfer network address by software processing consuming several hundreds of clocks, the router of this invention can calculate the transfer network address several hundreds of times faster.

The associative memory of this invention is advantageous in the following respects. As described above, when a plurality of storage data are coincident with the single search data, a particular single word among the coincident storage state which corresponds to the shortest mask information, i.e., which has a least number of bits excluded from the search object by the mask information can be quickly identified in one or two clocks. The information of the particular single word can be directly delivered out of the memory.

In case where the output information of the associative memory is used in producing write/read addresses for other memory devices, it is possible to use an encoder without a priority function. Therefore, use of the associative memory of this invention contributes to reduction in size of the system and increase in operation speed. In the conventional priority encoder, a finally selected word may be different depending upon the predetermined priority rule or the order of storage of the data into the associative memory. On the other hand, the finally selected word is never different in the associative memory of this invention. It is therefore unnecessary to take into account the order of the data to be written into the associative memory. Thus, as the network system deals with a greater amount of data, the associative memory of this invention exhibits a greater effect. Furthermore, the associative memory of this invention can be achieved by a circuit scale on the order of 1.3 times that of the conventional associative memory.

If the associative memory of this invention is incorporated into the router for calculating the network address, the transfer network address can be calculated more than several hundreds of times faster than the conventional router. Specifically, the conventional router requires several hundreds of clocks to calculate the optimum transfer network address by software processing. On the other hand, the associative memory of this invention can calculate the optimum transfer address in one or two clocks.

As will be understood from the foregoing, the network system using the router of this invention does not require sorting of the order of the user addresses to be stored in the associative memory in the router. Therefore, sorting of the words following the registration and the cancellation of the users in the conventional router is no longer necessary. This shortens the time during which the network communication is interrupted. The effect is greater as the number of users increases. In particular, the effect is extremely large if applied to the computer network system in which the number of users is drastically increasing.

What is claimed is:

1. An associative memory including first means for storing a plurality of associative memory words, each of which is a pair of a storage datum and a mask datum, said associative memory comprising second means for carrying out, when at least two of said associative memory words are selected as selected words in a primary searching operation with respect to an external search datum, a logical operation of the mask data of said selected words that determines a shortest mask by which a least number of bits of a respective datum are excluded from a search object in said primary searching operation.

2. An associative memory as claimed in claim 1, further comprising third means for carrying out a secondary searching operation of searching a particular one of said mask data coincident with the result of said logical operation to select a particular one of said associative memory words including said particular one of the mask data.

3. An associative memory as claimed in claim 1, further comprising third means for carrying out a secondary searching operation of searching the mask data of said associative memory words coincident with the result of said logical operation to select a particular one of said associative memory words which is selected in the primary searching operation and which includes a particular one of said mask data that is coincident with the result of said logical operation in the secondary searching operation.

4. An associative memory as claimed in claim 1, wherein said logical operation is a logical multiplication (an AND operation).

5. A continuation of first and second associative memories, said first associative memory storing a plurality of first words, each of which is a pair of a storage datum and a mask datum, said first associative memory comprising means for carrying out, when at least two of said first words are selected as selected words as a result of a searching operation for an external search datum, a logical operation of the mask data of said selected words that determines a shortest mask by which a least number of bits of a respective datum are excluded from a search object in said searching operation, said second associative memory storing a plurality of second words, each of said second words comprising a plurality of bits twice in number than each first word, each of said second words comprising a first bit group storing said storage datum and said mask datum stored in each of said first words of said first associative memory at corresponding addresses, and a second bit group storing the mask datum stored in said first bit group of the same second word, the result of said logical operation being supplied in the searching operation to said second bit group of said second associative memory while said search datum is supplied to said first bit group of said second associative memory, selection being made, among said storage data in said second words of said second associative memory, of a particular one of said second words storing said storage datum and said mask datum coincident in bit information with said search datum and the result of said logical operation, respectively.

6. An associative memory which stores mask information for every single word of storage information to indicate a valid state or an invalid state representative of whether or not every single bit or every plural bits of said storage information should be excluded from a search object, said associative memory comprising first searching means for selecting, among all of those mask information corresponding to one or more storage information coincident with said search data, a particular mask information as a shortest mask information by which a least number of bits of said storage information are excluded from said search object and for delivering said shortest mask information to a shortest mask signal line, and second searching means for producing an identification signal for identifying, among said one or more storage information coincident with said search data, a particular storage information corresponding to said particular mask information coincident with said shortest mask signal line.

7. An associative memory as claimed in claim 6, wherein said first searching means comprises an associative memory with a shortest mask producing function which has for each word of said storage information a match line to be put into a valid state when said search data and said storage data with said mask information added are coincident with each other and which has a shortest mask calculation circuit for calculating, when at least one storage information is coincident with said search data, a logical product for all of those mask information corresponding to said coincident storage data with a mask valid state as true to supply said logical product to a shortest mask signal line.

8. An associative memory as claimed in claim 6, wherein said second searching means comprises an ordinary associative memory storing in a single word a combination of said storage information and said mask information as a search object, said associated memory being supplied with a combination of said search data supplied to said first searching means and said shortest mask signal produced by said first searching means as search data of a single word.

9. An associative memory as claimed in claim 7, further comprising a shortest mask producing circuit composed of a first logical circuit for producing a mask invalid state for every single bit of said mask information in a single word when said match line corresponding to said single word is in a valid state and the bit of said mask information is in an invalid state, and a second logical circuit supplied from said first logical circuit with the states of said mask information of all words at a same bit position for carrying out logical multiplication with the mask valid state as true to deliver the result of logical multiplication to a shortest mask signal line at the corresponding bit position.

10. An associative memory as claimed in claim 9, wherein said first logical circuit has first and second transistors inserted in cascade between said shortest mask signal line at the corresponding bit position and a mask invalid state potential for each single bit of the said information of one word, said first transistor being put into a conductive state and an opened state when said match line corresponding to the word is in a valid state and an invalid state, respectively, said second transistor being put into a conductive state and an opened state when a bit of said mask information is in an invalid state and a valid state, respectively.

11. An associative memory as claimed in claim 6, wherein said first searching means comprises first memory means for storing shortest mask signal search data and coincidence detecting means for comparing storage information in said first memory means and mask information combined with storage information coincident with external search information to supply a second match line with the result of comparison, so that said first and said second searching means share their components with each other.

12. An associative memory as claimed in claim 11, wherein said coincidence detecting means comprises selecting means for selecting either said external search information or an output signal of said first memory means as input search data, second memory means for storing word by word the value on said match line corresponding to every single word, and comparing means for supplying said second match line with a valid state when coincidence is detected as a result of comparison between said mask information and said search data for each single word and when said stored state in said second memory means in the word is a valid state.

13. An associative memory as claimed in claim 12, wherein said comparing means comprises mask comparing means for supplying said second match line with an invalid state when incoincidence is detected as a result of comparison between said mask information and said search data for every single bit of said mask information in a single word, and second memory means in said single word for supplying said second match line with an invalid state when said stored state is an invalid state.

14. An associative memory as claimed in claim 13, wherein said comparing means forms a wired logic by connecting outputs of said mask comparing means and said second memory means to said second match line.

15. A router having an associative memory which stores storage information and mask information combined with every single word of said storage information to indicate by a valid state and an invalid state whether or not a single bit or plural bits of said storage information are to be excluded from a search object and which stores routing information, said router comprising:

first searching means for supplying, when one or more routing information is coincident with a destination network address of input transfer data, a shortest mask signal line with a particular mask information which is selected from all of said mask information corresponding to said routing information coincident with said destination network address and which corresponds to a particular routing information with a least number of bits to be excluded from said search object;

second searching means for producing a coincidence signal identifying, among one or more routing information coincident with said destination network address, said particular routing information corresponding to said particular mask information coincident with said shortest mask signal line;

means responsive to said coincidence signal for determining a transfer address of said input transfer data; and means for transferring said input transfer data to said transfer addresses.

16. A router having a routing information table which stores a plurality of routing information and mask information combined with every single word of said routing information to indicate by a valid state and an invalid state whether or not a single bit or plural bits are to be excluded from a search object, said router comprising:

means for producing, when one or more routing information is coincident with a destination network address of input transfer data, a shortest mask signal representative of a particular mask information which is selected from all of said mask information corresponding to said routing information coincident with said destination network address and which corresponds to a particular routing information with a least number of bits to be excluded from said search object;

means for producing a coincidence signal identifying, among one or more routing information coincident with said destination network address, said particular routing information corresponding to said particular mask information coincident with said shortest mask signal;

means for determining a transfer address of said input transfer data in response to said coincidence signal; and means for transferring said input transfer data to said transfer address.

* * * * *